(12) United States Patent
Bossen

(10) Patent No.: US 8,736,467 B2
(45) Date of Patent: May 27, 2014

(54) ADAPTIVE BINARIZATION FOR ARITHMETIC CODING

(75) Inventor: Frank Jan Bossen, Mountain View, CA (US)

(73) Assignee: NTT DoCoMo, Inc., Tokyo (JP)

( * ) Notice: Subject to any disclaimer, the term of this patent is extended or adjusted under 35 U.S.C. 154(b) by 0 days.

(21) Appl. No.: 13/638,803

(22) PCT Filed: Apr. 8, 2011

(86) PCT No.: PCT/US2011/031782
§ 371 (c)(1),
(2), (4) Date: Oct. 1, 2012

(87) PCT Pub. No.: WO2011/127403
PCT Pub. Date: Oct. 13, 2011

(65) Prior Publication Data
US 2013/0028334 A1      Jan. 31, 2013

Related U.S. Application Data

(60) Provisional application No. 61/322,596, filed on Apr. 9, 2010.

(51) Int. Cl.
*H03M 7/00* (2006.01)
(52) U.S. Cl.
USPC ............................................. 341/107; 341/51
(58) Field of Classification Search
USPC ..................................................... 341/51, 107
See application file for complete search history.

(56) References Cited

U.S. PATENT DOCUMENTS

| 8,401,321 B2* | 3/2013 | Lee ................................. 382/247 |
| 2005/0053143 A1 | 3/2005 | Holcomb et al. |
| 2009/0232408 A1* | 9/2009 | Meany ........................... 382/246 |
| 2010/0040148 A1* | 2/2010 | Marpe et al. .............. 375/240.16 |

OTHER PUBLICATIONS

International Preliminary Report on Patentability for International Application No. PCT/US2011/031782, dated Oct. 9, 2012, 7 pages.
International Search Report and Written Opinion of the International Searching Authority for International Application No. PCT/US2011/031782, dated Sep. 2, 2011, 7 pages.
Witten, Ian H. et al., "Arithmetic Coding for Data Compression," Communications of the ACM, vol. 30, No. 6, Jun. 1987, pp. 520-540.

* cited by examiner

*Primary Examiner* — Khai M Nguyen
(74) *Attorney, Agent, or Firm* — Brinks Gilson & Lione

(57) ABSTRACT

The present invention first provides adaptive binarization in which a binarizer outputs binary symbol in length, which is variable adaptively to the probability of the source. When the probability is low, it is desirable to decrease the length of the binary symbols to improve the efficiency of arithmetic coding and reduce the complexity of coding calculation. On the other hand, when the probability is high, it is desirable to increase the length of the binary symbols to improve the overall process speed of a decoder. Specifically, a binarizer, according to the present invention, binarizes mapping unit values from a non-binary symbol into binary symbols. The number of binary symbols is inversely proportional to the size of the mapping unit value. In the present invention, the mapping unit value is made variable adaptively to the probability. Thus, the number of binary symbols from the binarizer is also variable adaptively to the probability parameter.

22 Claims, 22 Drawing Sheets

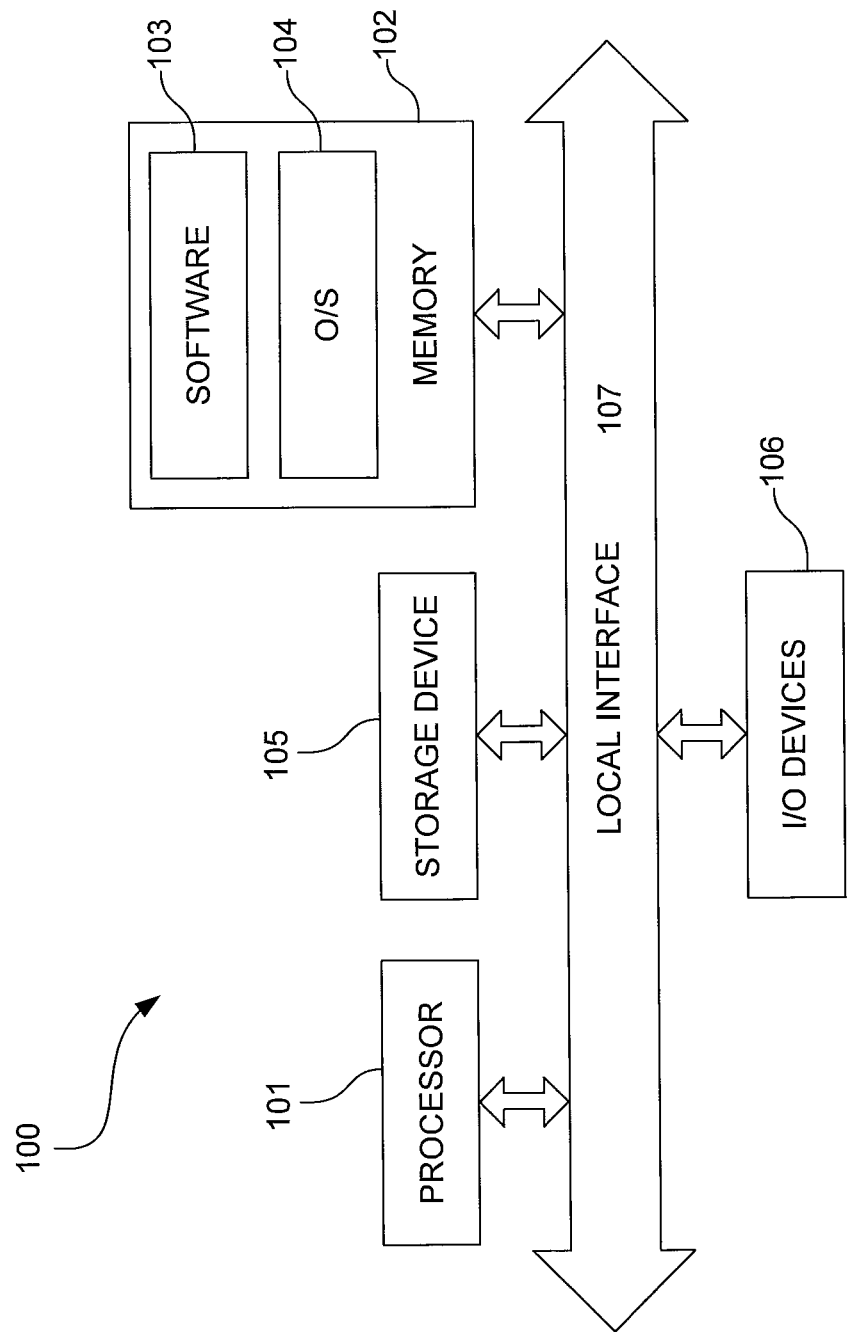

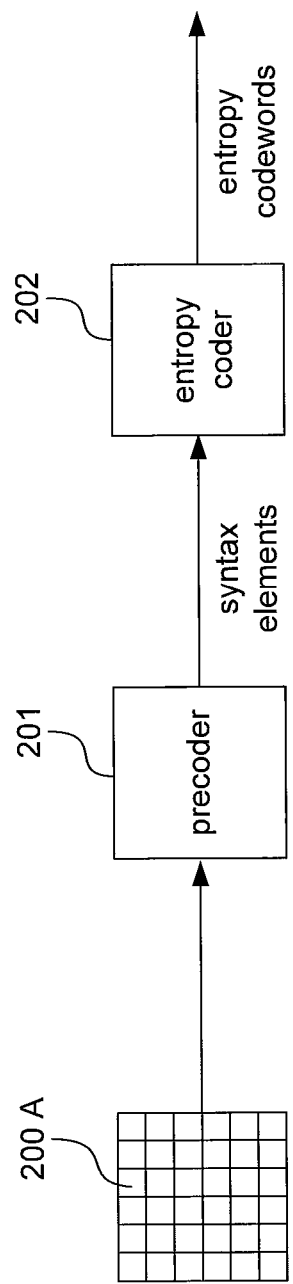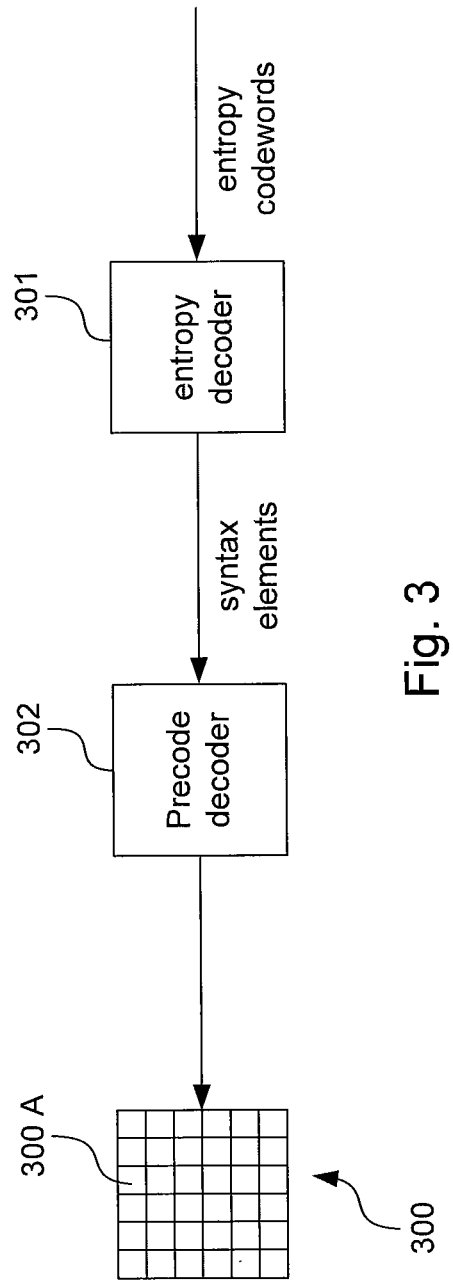

| pStateIdx | 0 | 1 | 2 | 3 | 4 | 5 | 6 | |
|---|---|---|---|---|---|---|---|---|
| p(pStateIdx) | $p_0$ | $p_1$ | $p_2$ | $p_3$ | $p_4$ | $p_5$ | $p_6$ | .... |

Fig. 24

| pStateIdx | 0 | 1 | 2 | 3 | 4 | 5 | |
|---|---|---|---|---|---|---|---|
| TransIdx | 31 | 32 | 33 | 34 | 35 | 36 | .... |

Fig. 25

| pStateIdx | 0 | 1 | 2 | 3 | 4 | 5 | |
|---|---|---|---|---|---|---|---|
| pUpdateIdxA | 21 | 22 | 23 | 24 | 25 | 26 | .... |
| pUpdateIdxB | 15 | 16 | 17 | 18 | 19 | 20 | |

Fig. 26

ADAPTIVE BINARIZATION FOR ARITHMETIC CODING

The application is a 371 application of PCT/US2011/31782 having an international filing date of Apr. 8, 2011, which claims the benefit of the filing date under 35 U.S.C. §119(e) of Provisional U.S. Patent Application Ser. No. 61/322,596, filed Apr. 9, 2010, the entire contents of which are hereby incorporated by reference.

BACKGROUND OF THE INVENTION

1. Technical Field Text

The present invention relates to arithmetic coding and in particular to arithmetic coding which adaptively estimates a probability to accurately account for the probability in a finite precision environment and limit the ratio of symbols to bits representative of the symbols.

2. Background Information

Arithmetic coding has been successfully applied to compression of media data such as images, and audio. The newest video coding standard H.264/AVC proposed by the ITU-T and MPEG, which is incorporated herein by reference, achieves a significant performance improvement over previous coding standards such as H.263 and MPEG 2. H.264/AVC standard supports two different entropy coding methods, i.e., Context-based Adaptive Variable Length Coding (CAVLC) and Context-based Adaptive Binary Arithmetic Coding (CABAC). Compared with CAVLC, CABAC provides higher coding efficiency at average bit rate saving of 9%-14%. See Li Liu and Xinhua Zhuang "CABAC Based Bit Estimation for First H.264 Rd Optimization Decision," IEEE, 2009, which is incorporated herein by reference.

The basic idea of the CABAC encoding process is recursive interval division. The CABAC engine keeps two registers. The first register is a range register with 9-bits. The second register is an offset register which is 9-bits in a regular mode and 10-bits in a bypass mode. The range register keeps track of the width of the current interval. The offset is from the bit-stream and points to the current location within the range. When decoding a bin, the range is divided into two subintervals depending on the probability of occurrence unique to the bin. After the bin is decoded, the range and offset are updated. After decoding one bin, range and offset will be renormalized to keep the precision to decode a next bin. It ensures the most significant bit of the 9 bit register range is always 1.

Although theories have shown that CABAC is an efficient coding method, practical implementation of CABAC poses some technical issues, particularly when a symbol to be coded has a high probability of occurrence. For example, in the CABAC coding engine in which calculations are performed on numbers whose digits of precision are limited by the available lengths of registers for use in calculations, the highest probability represented by the coding model is limited by the finite precision constraints. The finite precision constraints prevent symbols with high probabilities of occurrence from being coded efficiently, since the high probabilities cannot be accurately represented in the finite precision environment. Also, in CABAC, symbols with high probabilities of occurrences are compressed to a high degree, and thus fewer bits are necessary to encode symbols with high probability of occurrence. However, the video decoding performance of a decoder is typically evaluated by the number of bits processed within a predetermined time period. If a large number of symbols are encoded in a small number of bits, although the CABAC decoding speed improves, the overall processing speed at a decoder deteriorates.

Symbols with low probabilities of occurrence also present technical challenges in practical implementation of CABAC. Integer symbols used in MPEG, e.g., transform coefficients and motion vector differences, can be modeled by the following geometric distribution:

$$p(k) = (1-p)^{k-1} \times p$$

where k is the absolute value of a symbol, p is the model parameter, and p(k) is the probability of occurrence of the symbol. This type of distribution is amenable to binary arithmetic coding under CABAC, in which the value k is encoded using k−1 binary symbols A followed by one binary symbol B. For an ideal arithmetic coder and for a stationary source with a known parameter p, the expected number of bits required to encode the value k is equal to $$-(k-1) \times \log_2(1-p) - \log_2 p.$$

In practical implementation, since the parameter p is usually not known, and the source may be non-stationary, the parameter p is adaptively estimated based on the frequencies of the respective binary symbols. Although H.264/AVC provides adaptive estimation techniques with which the parameter p is conveniently estimated, they operate at the cost of coding efficiency penalty. In a CABAC coding engine which adaptively estimates the parameter p, the number of bits used to encode the value k from stationary source can be approximated by $$-(k-1) \times \log_2(1p) - \log_2 p + k \times z$$

z has a value in the range of 0.01 to 0.02 and represents an inefficiency associated with the estimation process. Given that an expected value of k may be expressed by 1/p, the above equation becomes $$-\frac{1-p}{p} \times \log_2(1-p) - \log_2 p + \frac{z}{p}.$$

Thus, as the parameter p becomes small, the inefficiency associated with z is increased, and the number of bits used to encode the value k becomes significantly larger than the theoretically required number of bits. In other words, as the parameter p becomes small, the arithmetic coder is no longer able to efficiently compress the symbol. Furthermore, the inefficiency is aggregated by the constraints posed by the finite precision environment, i.e., the inability to perform accurate coding calculations when the parameter p is small.

To address these issues, H.264/AVC has introduced a threshold value t in the coding process. If the value of k is smaller than or equal to the threshold value t, the value of k is encoded using k−1 binary symbols A followed by one binary symbol B. If the value of k is larger than the threshold value t, the value k is encoded using t symbols A followed by an escape sequence representing k minus t. In H.264/AVC, the escape sequence is formed by the exponential Golomb coding. However, this solution is sub-optimal because the threshold t is predetermined in an ad-hoc fashion, and the structure of the escape sequence may not accurately represent the statistical properties of the source.

SUMMARY OF THE INVENTION

In view of the above issues suffered by the conventional arithmetic coder, the present invention first provides adaptive binarization in which a binarizer outputs binary symbol in length which is variable adaptively to the probability of the source. When the probability is low, it is desirable to decrease the length of the binary symbols to improve the efficiency of arithmetic coding and reduce the complexity of coding calculation. On the other hand, when the probability is high, it is desirable to increase the length of the binary symbols to improve the overall process speed of a decoder.

Specifically, the present invention provides an arithmetic encoder which comprises a binarizer configured to binarize a mapping unit value from a non-binary symbol into one binary symbol at each encoding round. The number of binary symbols is inversely proportional to the size of the mapping unit value. If the mapping unit value becomes larger, the number of binary symbols from the binarizer becomes small, or vice versa. The encoder further comprises an arithmetic coding engine configured to encode binary symbols from the binarizer one at each encoding round, using a probability parameter which is transitionable over encoding rounds. In the present invention, the mapping unit value is made variable, and thus the number of binary symbols from the binarizer is also variable and a function of the mapping unit value. Also, the mapping unit value is variable adaptively to the probability parameter. Therefore, according to the present invention, the number of binary symbols from the binarizer is variable adaptively to the probability parameter.

The present invention introduces a size parameter which is variable adaptively to the probability parameter. The size parameter determines the mapping unit value. In one embodiment, the probability parameter is examined at each encoding round to see if the size parameter needs to be varied. When the probability parameter is found low, the size parameter is varied to increase the mapping unit value, thereby reducing the number of binary symbols from the binarizer. When the probability parameter is found high, the size parameter is varied to decrease the mapping unit value, thereby increasing the number of binary symbols from the binarizer. In either case, the probability parameter is adjusted to compensate a change of the fragment value. Therefore, in the present invention, the probability parameter remains in a range where the probability is accurately represented even under the finite precision constraint.

The present invention also provides an arithmetic decoder that works in tandem with the above arithmetic encoder. The arithmetic decoder according to the present invention comprises an arithmetic decoding engine configured to decode arithmetic codewords into binary symbols one at each decoding round, using a probability parameter which is transitionable over decoding rounds. The encoder also comprises a de-binarizer configured to de-binarize the binary symbols one at each decoding round into mapping unit values summed for reconstruction of an non-binary symbol, wherein the mapping unit value is variable adaptively to the probability parameter. In one embodiment, the mapping unit value is determined by a size parameter which is variable adaptively to the probability parameter.

In the decoder, it is determined, based on the probability parameter, at each decoding round whether the size parameter needs to be varied. When the probability parameter is low, the size parameter varies to increase the mapping unit value. When the probability parameter is high, the size parameter varies to decrease the mapping unit value. In either case, the probability parameter is adjusted to compensate a change in the mapping unit value.

BRIEF DESCRIPTION OF THE DRAWINGS

FIG. 1 is a block diagram showing an exemplary hardware architecture on which the present invention could be implemented.

FIG. 2 is block diagram showing a general view of a video encoder to which the present invention could be applied.

FIG. 3 is a block diagram showing a general view of a video decoder to which the present invention could be applied.

FIG. 24 shows an exemplary structure of a context model table in which probability estimates $p_0, p_1, p_2 \ldots$ are stored in relation to index values of pStateIdx.

FIG. 25 shows an exemplary structure of a transition table in which adjusted index values of pStateIdx are stored in relation to a current index values of pStateIdx.

FIG. 26 shows an exemplary structure of an update table in which updated index values of pStateIdx are stored in relation to a current index value of pStateIdx.

DETAILED DESCRIPTION OF THE DRAWINGS AND THE PRESENTLY PREFERRED EMBODIMENTS

Figure 4:
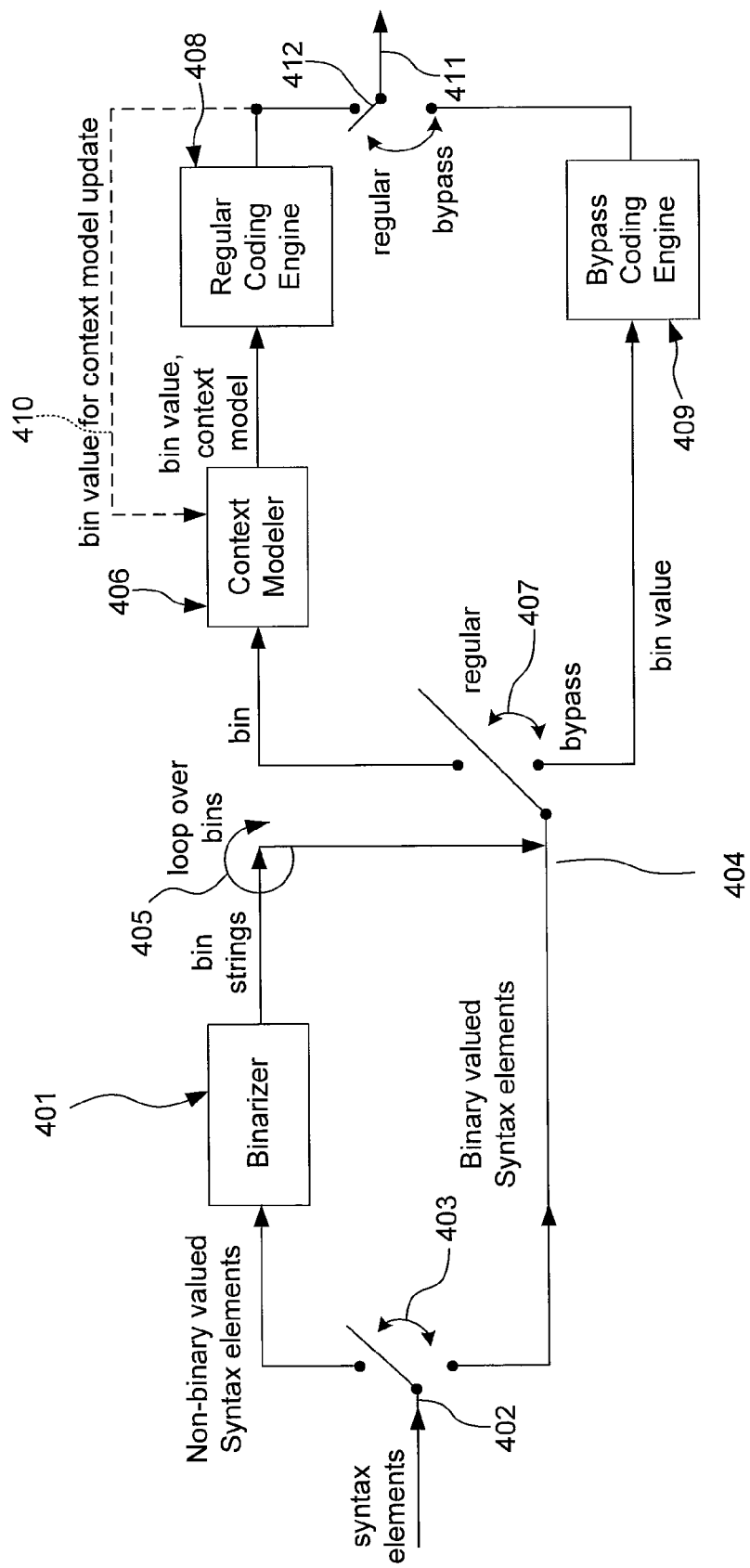
FIG. 4 is a block diagram showing the functional modules of the entropy coder according an embodiment of the present invention.

FIG. 1 shows an exemplary hardware architecture of a computer 100 on which the present invention could be implemented. Please note that the hardware architecture shown in FIG. 1 may be common in both a video encoder and a video decoder which implement the embodiments of the present invention.

The computer 100 includes a processor 101, memory 102, storage device 105, and one or more input and/or output (I/O) devices 106 (or peripherals) that are communicatively coupled via a local interface 107. The local interface 105 can be, for example, but not limited to, one or more buses or other wired or wireless connections, as is known in the art.

The processor 101 is a hardware device for executing software, particularly that stored in the memory 102. The processor 101 can be any custom made or commercially available processor, a central processing unit (CPU), an auxiliary processor among several processors associated with the computer 100, a semiconductor based microprocessor (in the form of a microchip or chip set), or generally any device for executing software instructions.

The memory 102 comprises a computer readable medium which can include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory 102 may incorporate electronic, magnetic, optical, and/or other types of storage media. A computer readable medium can be any means that can store, communicate, propagate, or transport the program for use by or in connection with the instruction execution system, apparatus, or device. Note that the memory 102 can have a distributed architecture, where various components are situated remote from one another, but can be accessed by the processor 101.

The software 103 in the memory 102 may include one or more separate programs, each of which contains an ordered listing of executable instructions for implementing logical functions of the computer 100, as described below. In the example of FIG. 1, the software 103 in the memory 102 defines the computer 100 video encoding or video decoding functionality in accordance with the present invention. In addition, although not required, it is possible for the memory 102 to contain an operating system (O/S) 104. The operating system 104 essentially controls the execution of computer programs and provides scheduling, input-output control, file and data management, memory management, and communication control and related services.

The storage device 105 of the computer 100 may be one of many different types of storage device, including a stationary storage device or portable storage device. As an example, the storage device 105 may be a magnetic tape, disk, flash memory, volatile memory, or a different storage device. In addition, the storage device 105 may be a secure digital memory card or any other removable storage device 105.

The I/O devices 106 may include input devices, for example but not limited to, a touch screen, a keyboard, mouse, scanner, microphone, or other input device. Furthermore, the I/O devices 106 may also include output devices, for example but not limited to, a display, or other output devices. The I/O devices 106 may further include devices that communicate via both inputs and outputs, for instance but not limited to, a modulator/demodulator (modem; for accessing another device, system, or network), a radio frequency (RF), wireless, or other transceiver, a telephonic interface, a bridge, a router, or other devices that function both as an input and an output.

As is well known by those having ordinary skill in the art, video compression is achieved by removing redundant information in a video sequence. Many different video coding standards exist, examples of which include MPEG-1, MPEG-2, MPEG-4, H.261, H.263, and H.264/AVC. It should be noted that the present invention is not intended to be limited in application of any specific video coding standard. However, the following description of the present invention is provided, using the example of the H.264/AVC standard, as it is the newest video coding standard. In H.264/AVC, each frame or picture of a video can be broken into several slices. The slices are then divided into blocks of 16×16 pixels called macroblocks, which can then be further divided into blocks of 8×16, 16×8, 8×8, 4×8, 8×4, down to 4×4 pixels.

FIG. 2 shows a general view of a video encoder to which the present invention could be applied. The blocks shown in the figure represent functional modules realized by the processor 101 executing the software 103 in the memory 102. A picture of video frame 200 is fed to a video pre-coder 201. The video pre-coder treats the picture 200 in units of macroblocks 200A. Each macroblock contains several picture samples of picture 200. On each macroblock a transformation into transformation coefficients is performed followed by a quantization into transform coefficient levels. Moreover, intra-frame prediction or motion compensation is used in order not to perform the coding steps directly on the pixel data but on the differences of same to predicted pixel values, thereby achieving small values which are more easily compressed.

For each slice, the pre-coder 201 generates a number of syntax elements, which form a coded version of the macroblocks of the respective slice. All residual data elements in the syntax elements, which are related to the coding of transform coefficients, such as the transform coefficient levels or a significance map indicating transform coefficient levels skipped, are called residual data syntax elements. Besides these residual data syntax elements, the syntax elements generated by the pre-coder 201 contain control information syntax elements containing control information as to how each macroblock has been encoded and has to be decoded, respectively. In other words, the syntax elements are dividable into two categories. The first category, the control information syntax elements, contains the elements related to a macroblock type, sub-macroblock type, and information on prediction modes both of a spatial and of temporal types as well as slice-based and macroblock-based control information, for example. In the second category, all residual data elements such as a significance map indicating the locations of all significant coefficients inside a block of quantized transform coefficients, and the values of the significant coefficients, which are indicated in units of levels corresponding to the quantization steps, are combined and become residual data syntax elements.

The pre-coder 201 outputs the syntax elements to an entropy coder 202, which is a CABAC encoder and explained in more detail below. The entropy coder 202 generates arithmetic codewords for each slice. When generating the arithmetic codewords for a slice, the entropy coder 202 exploits statistical dependencies among the data values of syntax elements in the video signal bit stream. The entropy coder 202 outputs arithmetic codewords for a slice of picture 200 to an entropy decoder shown in FIG. 3.

FIG. 3 shows a general view of a video decoder to which the present invention could be applied. Likewise, the blocks shown in the figure represent functional modules realized by the processor 101 executing the software 103 in the memory 102. The entropy decoder 301, which is a CABAC decoder and discussed in more detail below, receives the arithmetic codewords and decodes the codewords back into the syntax elements. A pre-code decoder 302 uses the syntax elements in order to retrieve, macroblock by macroblock and then slice after slice, the picture samples of pixels in the picture 300.

FIG. 4 shows the functional modules of the entropy coder 202 for encoding syntax elements into arithmetic codewords.

These functional modules are realized by the processor 101 executing the software 103 in the memory 102. The CABAC encoding process of a symbol comprises three stages of processing, i.e., binarization, context modeling and binary arithmetic coding. To effect the first stage of processing, the entropy coder 202 comprises a binarizer 401. An input of the binarizer 401 is connected to an input 402 via a switch 403. The input 402 provides syntax elements to be encoded by the entropy coder 202. The switch 403 is able to pass syntax elements arriving at the input 402 to either the binarizer 401 or a binarization output 404, thereby bypassing the binarizer 401. The switch 403 functions to pass non-binary valued syntax element to the binarizer 401. Examples for syntax elements that are not in a binarized form are motion vector differences and transform coefficient levels. The switch 403 also functions to directly pass a syntax element from the input 402 to the binarization output 404 if the syntax element is already in a binarized form.

The binarizer 401 maps the non-binary valued syntax elements to a bin string. A "bin" means the binary decision that has to be made at a node of a coding tree defining the binarization mapping of a non-binary value to a bit string, when transitioning from the root node of the coding tree to a leaf of the coding tree corresponding to the non-binary value of the non-binary syntax element to be binarized. Thus, a bin string is a sequence of bins or binary decisions and corresponds to a codeword having the same number of bits, each bit being the result of a binary decision. A bin string is adapted to the probability distribution of the syntax elements so as to enable very efficient binary arithmetic coding.

Bin strings outputted by the binarizer 401 may not be passed directly to the binarization output 404, but controllably passed to the output 404 by a bin loop over means 405 arranged between the output of binarizer 401 and the output 404 in order to merge bin strings outputted by the binarizer 401 and already binary valued syntax elements, bypassing the binarizer 401 to a single bit stream at the output 404.

To effect the second stage of processing, the entropy coder 202 comprises a context modeler 406 as well as a switch 407. An input of the context modeler 406 is connected to the binarization output 404 via the switch 407. An output of the context modeler 406 is connected to a regular coding engine 408. The switch 407 functions to pass the bits or bins of a bin sequence to either the context modeler 406 or to a bypass coding engine 409, thereby bypassing the context modeler 406.

For each bin that arrives, the context modeler 406 selects a context model, which approximates a probability distribution modeling statistical dependencies among the values of bins in a bin string, and which is used by the regular coding engine 408 to estimate the probability of occurrence of the respective bin in the bin string. Several contexts are allocated to each bin and the context selected for encoding a given bin depends on the properties of the macroblocks surrounding the current macroblock that is described by the syntax element being processed. The assignment of bins to a context model is such that the actual probability distribution of bins belonging to the same context model shows the same, or likewise behavior, so that the bin value probability estimates according to a certain context model are good approximations of the actual probabilities for all bins that are assigned to this context model.

It is noted that the probability distribution of bin values are unknown at the beginning of encoding and are different for different video sequences. Consequently, one of the properties that give CABAC its high coding efficiency is that the contexts, which store the probabilities of the bins to be encoded, are adaptive. Specifically, during encoding, the contexts are updated to achieve accurate estimation of the bin probabilities. A context updating occurs in response to the values of previously encoded bins. The same bin or same syntax element occurs several times in bins, but may be assigned to different context models each time they occur, depending on previously encoded bins. Since the probability estimate used for binary arithmetic coding determines the coding efficiency, it is important to have an adequate context model that exploits the statistical dependencies among the values of bins to a large degree, so that the probability estimate is always approximating very effectively the actual probability during encoding.

When having assigned a context model to an incoming bin, the context modeler 406 passes the bin over to the regular coding engine 408 together with the context model, which the bin is assigned to. The regular coding engine 408 effects the third stage of processing and arithmetically encodes the value of the bin passed from the context modeler 406 by use of the context model, also passed from the context modeler 406. Further, the regular coding engine 408 passes bin values for context model updates to the context modeler 406 over the feedback line 410.

Each time the regular coding engine 408 receives a bin from the context modeler 406, it estimates a probability of occurrence of the bin value according to the context model, also received from the context modeler 406. The regular coding engine 408 then arithmetically encodes the bin, using the probability estimate. Also, each time encoding a bin, the regular coding engine 408 adaptively updates the probability estimate for encoding of a next bin, based on the value of the previously encoded at least one bin. In one embodiment, the regular coding engine 408 calculates a probability estimate according to a received context model, based on the value of previously encoded at least one bin.

In another embodiment, the regular coding engine 408 is a finite state machine as defined in H.264/AVC and has tables associated with the context models. Each context model table has stored probability estimates. As a finite state machine, the regular coding engine 408 does not calculate probability estimates. Instead, the regular coding engine 408 has all the probability estimates as pre-defined constants in the context model tables. The probability estimates stored in each context model table are selectively identified by a probability index. Thus, each time receiving a bin and a context model from the context modeler 406, the regular coding engine 408 first selects a table associated with the received context model. The regular coding engine 408 then looks up the table and uses the probability index to find a probability estimate in the table which is needed to encode the bin. Also, the regular coding engine 408 updates the probability estimate by updating the probability index in order to adapt the probability estimate to the property or attributes of the picture or video frame from which the syntax elements or bins have been derived. Updating of the probability index is likewise based on previously encoded at least one bin.

The bypass coding engine 409 is for arithmetically encoding bin strings by use of a static, predetermined probability estimate. Some of the bins in the bin string outputted by the binarizer 401 show nearly an equi-probable distribution. This means that the bits corresponding to bins in a bin string have a 50/50 chance to be 1 or 0. These bins are fed to the bypass coding engine 409 and are arithmetically encoded by use of the equi-probable probability estimate, which is constant and thus eliminates the computational overheads associated with selection of a context model and updating of probability estimate.

The coded bits outputted from the regular coding engine 408 and the bypass coding engine 409 are merged to a single bit stream at an output 411 by a switch 412. The bit stream represents binary arithmetic codewords of the syntax elements as inputted in the input terminal 402. The regular coding engine 408 and the bypass coding 409 cooperate in order to perform arithmetical coding based on either an adaptive or a static probability estimation.

Figure 5:
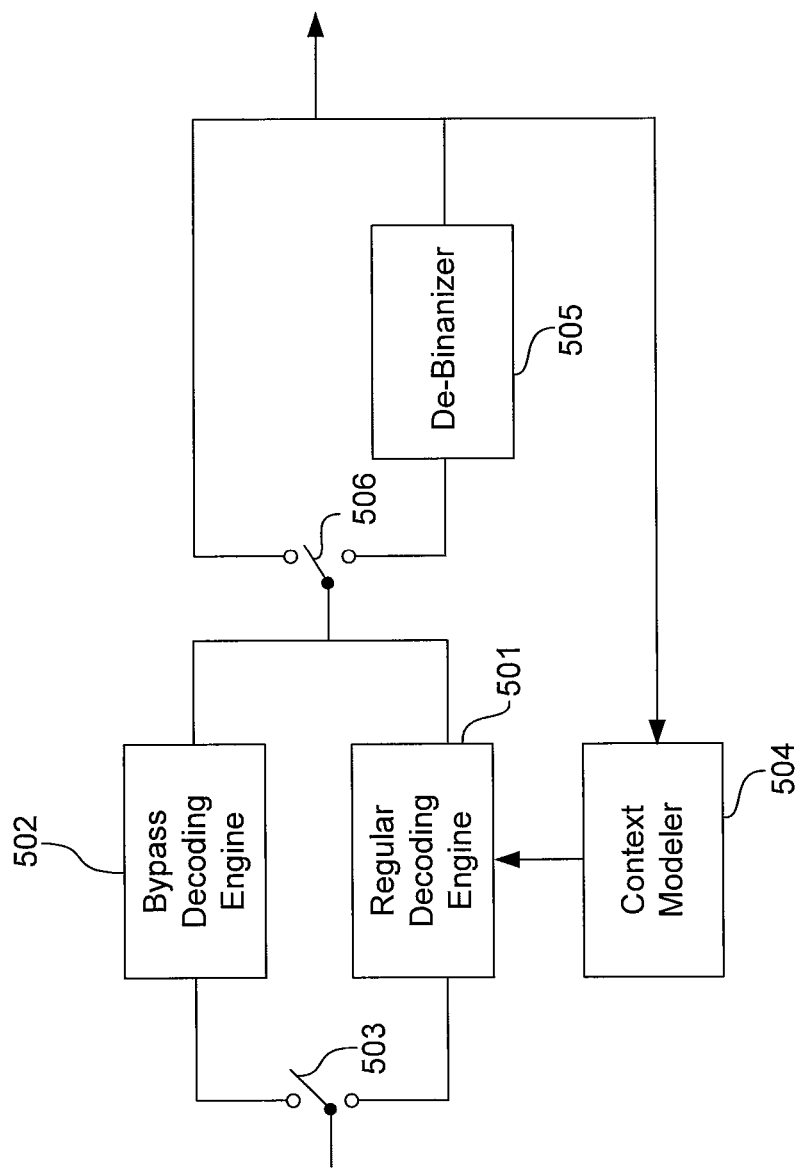
FIG. 5 is a block diagram showing the functional modules of the entropy decoder according to another embodiment of the present invention.

FIG. 5 shows the functional modules of the entropy decoder 301 for decoding the arithmetic codewords back into the syntax elements. These functional modules are realized by the processor 101 executing the software 103 in the memory 102. In FIG. 5, arithmetic codewords are received by either a regular decoding engine 501 or a bypass decoding engine 502 by the operation of a switch 503. The switch 503 functions to selectively pass arithmetic codewords encoded by the regular coding engine 408 to the regular decoding engine 501 and arithmetic codewords encoded by the bypass coding engine 409 to the bypass decoding engine 502. The regular decoding engine 501 decodes received codewords into decoded bins, using adaptive probability estimation according to context models provided by a context modeler 504. The bypass decoding engine 502 decodes received codewords into decoded bins, using the equi-probable static probability estimate. The decoded bins either advance to a de-binarizer 505 for de-binarization or bypass the de-binarizer 505 by the operation of a switch 506. The de-binarizer 505 de-binarizes the decoded bins into syntax elements. The syntax elements are fed back to the context modeler 504 for updating of a context model to be provided to the regular decoding engine 501. Each time decoding a codeword, the regular decoding engine 501 updates the probability estimates, based on previously decoded at least one bin.

In one embodiment, the regular decoding engine 501 calculates a probability estimate according to a received context model, based on previously decoded at least one bin. In another embodiment, the regular decoding engine 501 is a finite state machine as defined in H.264/AVC and has tables associated with the context models. Each context model table has stored probability estimates. As a finite state machine, the regular decoding engine 501 does not calculate the probability estimate. Instead, the regular decoding engine 501 has all the probability estimates as pre-defined constants in the context model tables. The probability estimates stored in each context model table are selectively identified by a probability index. Thus, each time receiving an arithmetic codeword and a context model, the regular decoding engine 501 first selects a table associated with the received context model. The regular decoding engine then looks up the table and uses the probability index to find a probability estimates in the table which is needed to encode the codeword. Also, the regular decoding engine 501 updates the probability estimate by updating the probability index. Updating of the probability index is based on previously decoded at least one bin.

Turning now to detailed operations of the entropy coder 202 and the entropy decoder 301, the attached flowcharts show software processes performed by the entropy coder 202 and the entropy decoder 301 for CABAC encoding and decoding. It should be understood that the the encoding and decoding processes described in the attached flowcharts are performed collectively by the functional modules of the entropy coder 202 and the entropy decoder 301 shown in FIGS. 4 and 5, which are realized by the processor 101 executing the software 103 in the memory 102. Please also note that in the following discussion, the present invention will be described, first using an embodiment which calculates probabilities without using tables, followed by another embodiment which adopts the finite state machine which obtains probabilities using tables.

In the following discussion, a binary symbol takes a value of either A or B. These values are used merely to distinguish between the two possible values a binary symbol takes. Also, a probability estimate p is used in the process of arithmetically encoding binary symbols, where the probability estimate p represents the probability associated with the symbol B. Alternatively, the probability estimate p may be replaced by q (=1−p), and updates top are modified accordingly.

Figure 6:
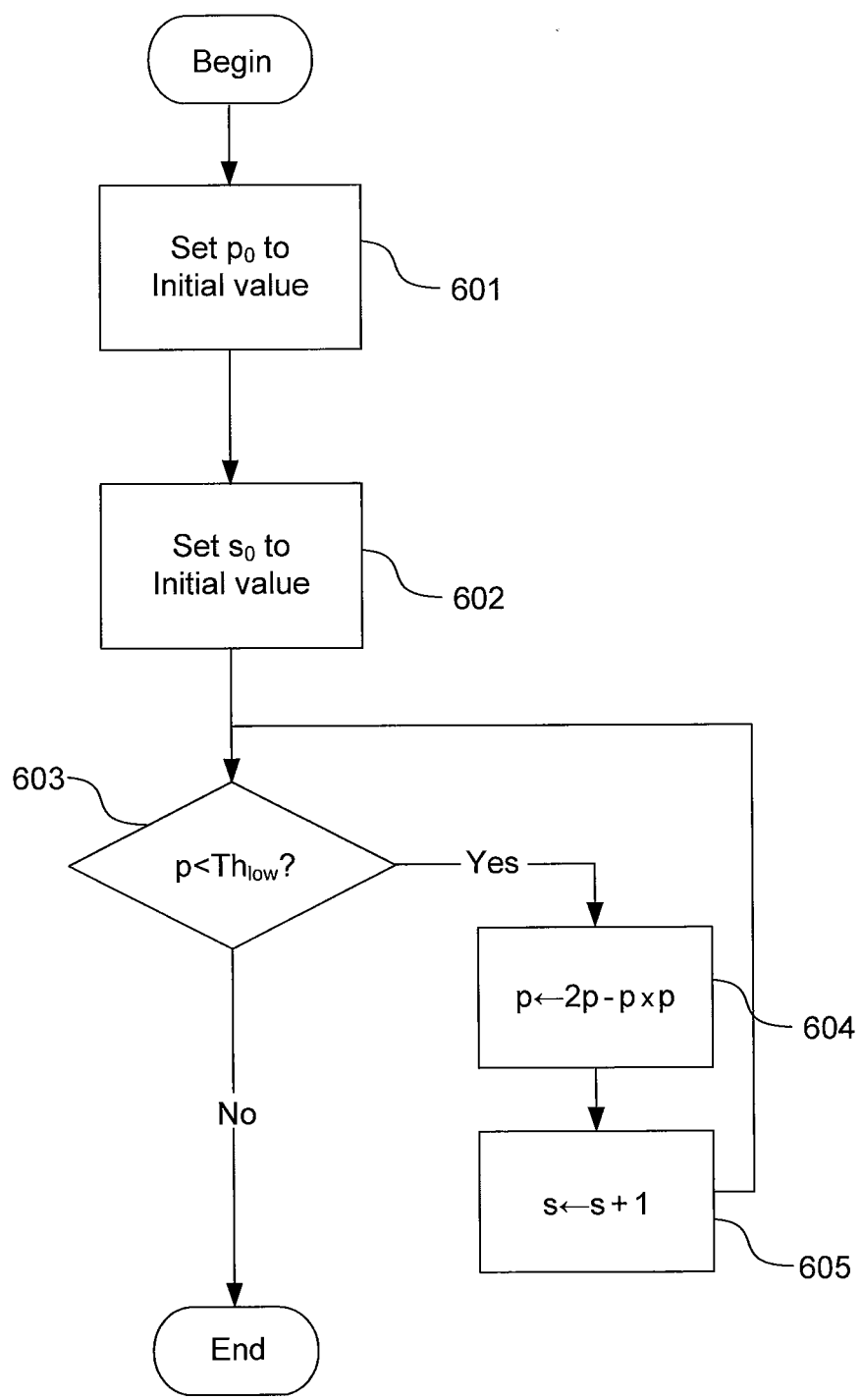
FIG. 6 is a flowchart showing an exemplary initializing process implemented in the entropy coder according to the embodiment of the present invention.

FIG. 6 is a flowchart showing an exemplary initializing process implemented in the entropy coder 202. In the initializing process, the probability estimate p is initialized to an initial probability estimate $p_0$ in Step 601. The initial probability estimate $p_0$ is a predetermined value. In one embodiment, the initial probability estimate $p_0$ is a fixed-point representation of a probability larger than 0 and smaller than 1. In Step 602, a suffix size s is also initialized to an initial suffix size $s_0$. The suffix size s determines the length of a bin string to be encoded, which is derived in the present invention through a process similar to the truncated unary binarization process. As the suffix size s becomes larger, the length of a bin string becomes shorter, or vice versa. In one embodiment, the initial suffix size $s_0$ is 0 ("zero").

In Step 603, the probability estimate p is compared to a predetermined threshold $Th_{low}$. In one embodiment, the threshold $Th_{low}$, corresponds to a fixed-point representation of value ⅛. If the probability estimate p is equal to or larger than the threshold $Th_{low}$, the initializing process ends. If the probability estimate p is smaller than the threshold $Th_{low}$, the process advances to Step 604, in which 2 times p minus p to the power of 2 is assigned to the probability estimate p. The suffix size s is then incremented by 1 in Step 605. The flow thereafter returns to the comparison step (Step 603). Steps 604 and 605 are repeated until the probability estimate p becomes equal to or larger than the threshold $Th_{low}$. A C-style pseudo code for the initialization process shown in FIG. 6 is shown below:

```
init_suffix(context) {
    suffix_size[context] = 0;
    while (p[context] < 0x2000) {
        suffix_size[context]++;
        p[context] = 2*p[context] − ((p[context]*p[context] +
0x8000) >> 16);
    }
}
```

In the present invention, the suffix size s is adaptively modified based on the value of the probability estimate p. When the probability estimate p is small, it is desirable to increase the suffix size s to make shorter the length of a bin string to be encoded. In CABAC, since a sub-range R0 is a product of the value of the range register and the probability estimate p, where the probability estimate p is small, the sub-range R0 becomes small. Also, in CABAC, the process of determining the sub-range R0 is recursive and repeated for the times equal to the number of bins in a bin string to be encoded, and the sub-range R0 becomes recursively small as encoding advances through the bins in a bin string. Therefore, where the probability estimate p is small, the recursively smaller sub-range R0 will become not accurately represented on the coding engine under the finite precision constraint, resulting in amplifying coding inefficiency and adding to the computational complexity. In the present invention, where the probability estimate p is small, the suffix size s is modified larger to shorten a bin string to be encoded, thereby reducing the number of recursive reductions in the sub-range R0. Thus, an increase in the suffix size s is expected to result in improving the efficiency of arithmetic coding and reducing the complexity thereof.

However, an increment of the suffix size s requires an adjustment of the probability estimate p. By incrementing the suffix size s by 1, two binary symbols or bins in a bin string which would be encoded separately with the probability estimate p are now encoded together. As will be discussed below, binarization of a symbol, according to the present invention, yields a series of binary symbols A, which is derived through a process similar to the truncated unary binarization process. Also, as discussed above, the probability estimate p is defined to represent the probability associated with symbol B. Therefore, an adjusted probability estimation (1-p') used to encode two binary symbols A together, each associated with the probability estimate (1-p), is:

$$(1-p')=(1p)^2 \text{ or } p'=2p-p^2.$$

In another embodiment, the initial probability estimate $p_0$ and the initial suffix size $s_0$ may be selected so as to dispense with the correction loop of Steps 603, 604 and 605. In another embodiment, the values of p and s are made selectable by a user and transmitted from the encoder to the decoder. Still further, in another embodiment, the values of p and s may be a function of a quantization step or of a frame size. Smaller quantization steps lead to larger transform coefficients and larger frame sizes lead to larger motion vector values.

Figure 7:
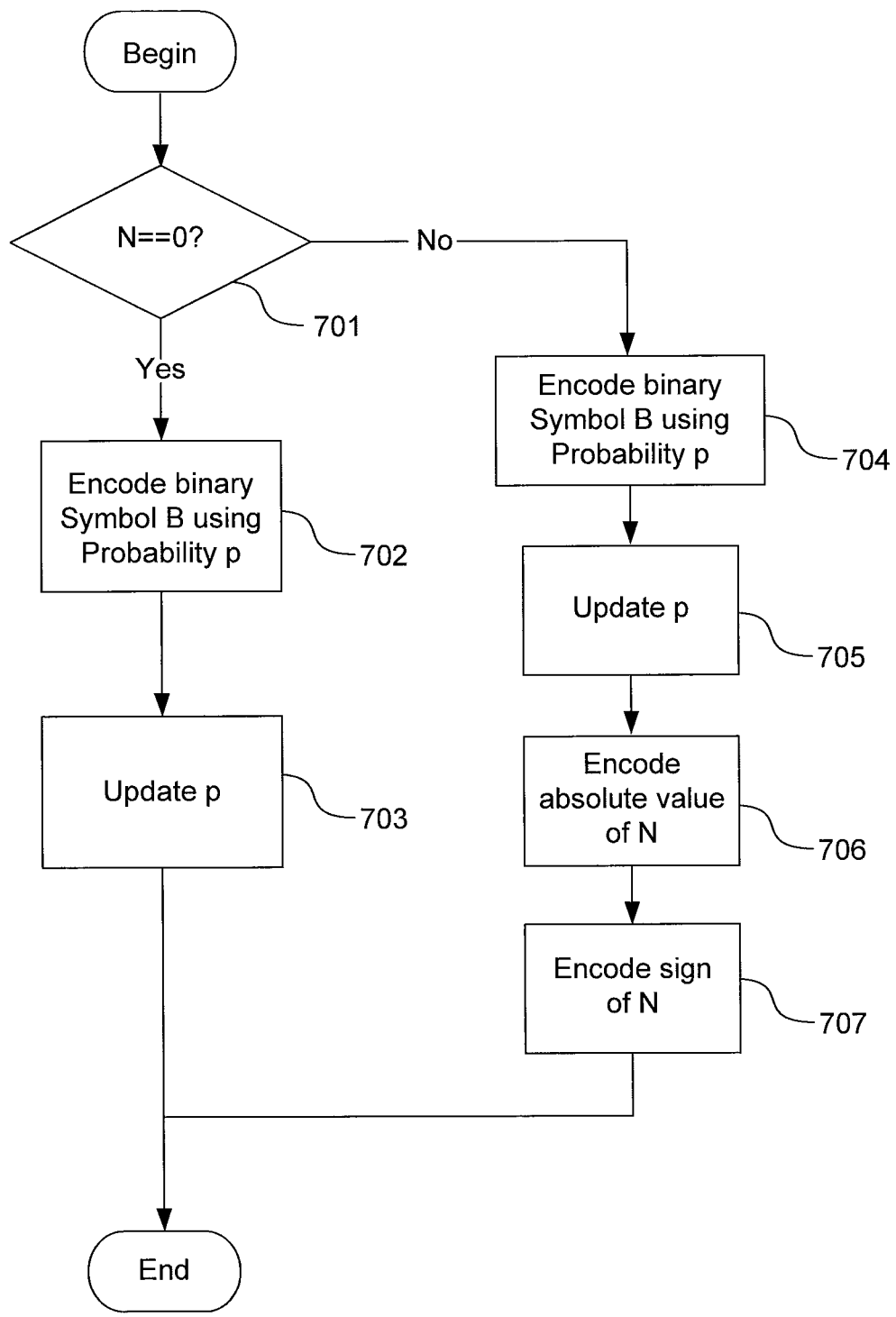
FIG. 7 is a flowchart showing a main encoding process according to another embodiment of the present invention.

FIG. 7 is a flowchart showing an encoding process according to an embodiment of the present invention, which is performed by the entropy coder 202. It is assumed that the encoding process shown in the flowchart encodes an integer symbol N, which may be signed or unsigned. The integer symbol N may represent the value of a transform coefficient in an image, video or audio codec, a motion vector difference in a video codec or other similar integer data. In the flowchart shown in FIG. 7, the value of N is compared to 0 ("zero") in Step 701. If the value of N is equal to 0, a binary symbol B is encoded using a probability estimate p in Step 702 and the probability estimate p is updated in Step 702 before the flow ends. If the value of N is not equal to 0, a binary symbol A is encoded using the probability estimate p in Step 704 and the probability estimate p is updated in Step 705.

Figure 8:
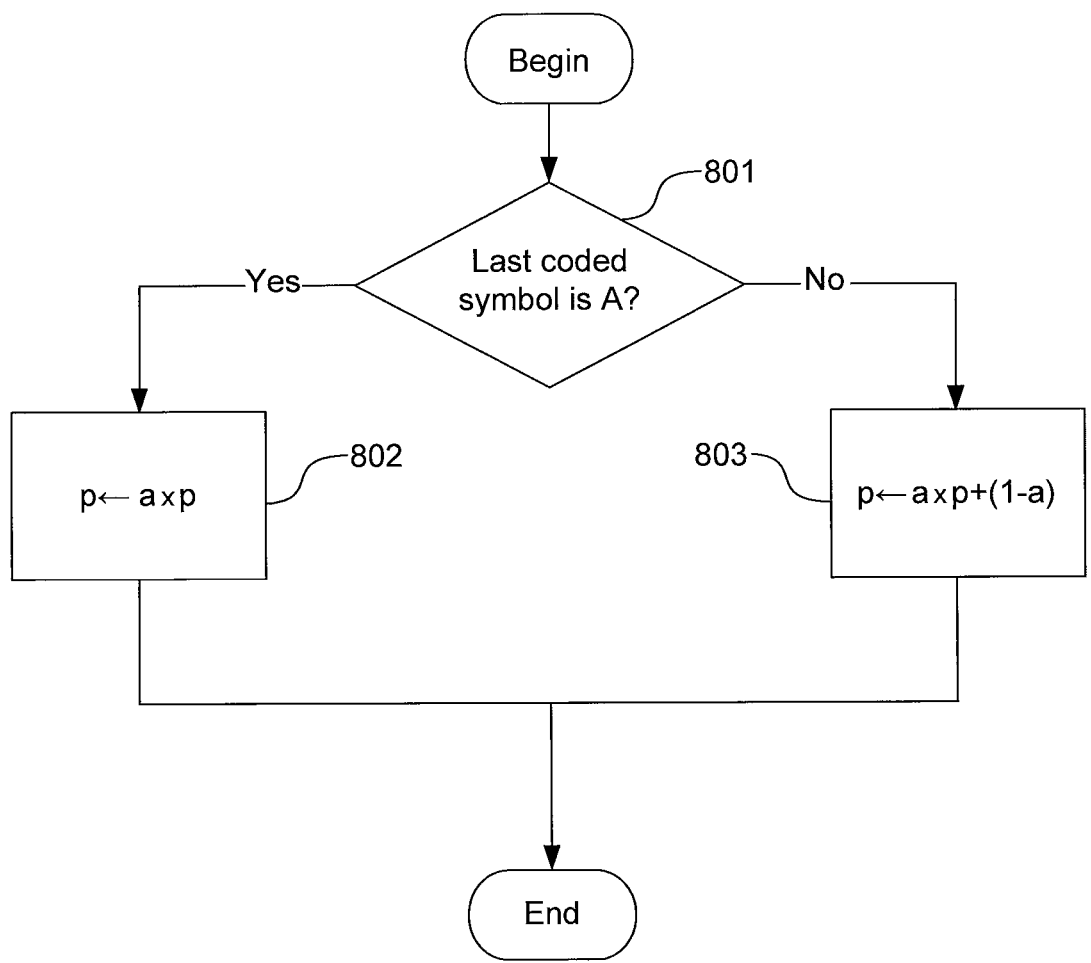
FIG. 8 is a flowchart showing a process of updating the probability estimate p performed in Steps 703 and 705 in FIG. 7.

FIG. 8 is a flowchart showing a process of updating the probability estimate p performed in Steps 703 and 705 in FIG. 7. In FIG. 8, it is determined in Step 801 whether the last encoded symbol is a symbol A. Where the last encoded symbol is a symbol A, a current value of the probability estimate p is multiplied by the value of a constant a in Step 802. Where the last coded symbol is not the symbol A, a current value of the probability estimate p is multiplied by the value of the constant a and added with (1—the value of the constant a) in Step 803. The value of the constant a is larger than 0 and smaller than 1. The value of the constant a determines how quickly the probability estimate p becomes adapted to the underlying probability distribution of the source. The smaller the value of the constant a, the faster the adaptation. In one embodiment, the constant a may be defined by $1-2^{-m}$, where m is selected from positive integers so as to avoid an arithmetic operation of multiplication in the updating process. m may have a predetermined value, such as 5, or may be transmitted from the encoder to the decoder. A C-style pseudo code for updating the probability estimate p is shown below:

```
update(context, symbol) {
    if (val == 0)
        p[context] += (0xffff – p[context] + round) >> loss_rate;
    else
        p[context] –= (p[context] + round) >> loss_rate;
}
```

Returning to FIG. 7, the symbol A or B encoded in Step 702 or 704 functions as header information for advising a decoder whether the encoded symbol is non-zero integer or equal to zero. After Step 705, the process flow proceeds to Step 706, in which the absolute value of N is encoded. The process for encoding the absolute value of N will be discussed below in detail with reference to FIG. 9. Still in FIG. 7, if the symbol N is a signed integer, the sign value is then encoded in Step 707. The sign value is represented by a one-bit sign symbol with values of 1 for negative symbols. The one-bit sign symbol goes through the bypass coding engine 409 shown in FIG. 4 for arithmetic coding.

Figure 9:
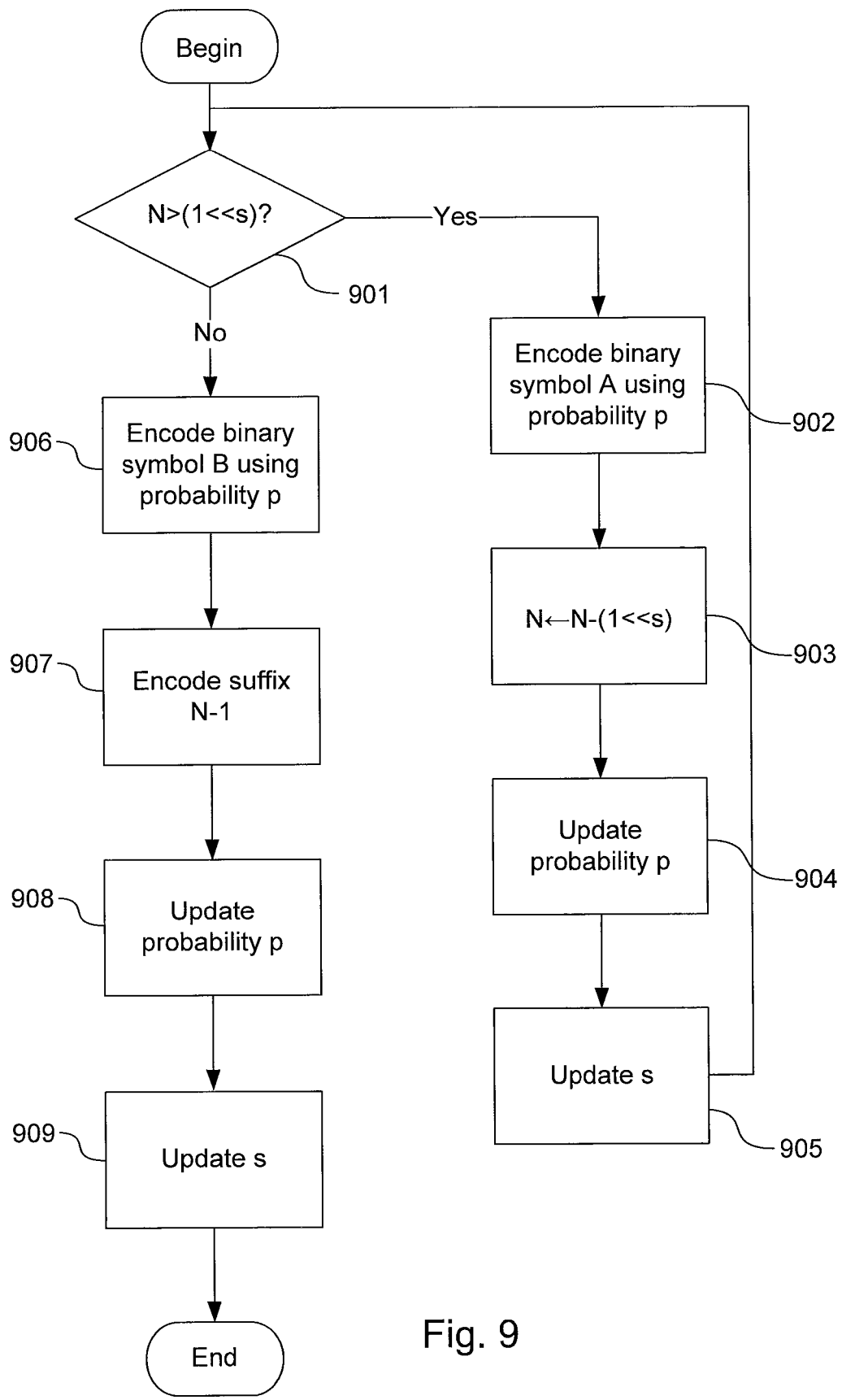
FIG. 9 is a flowchart which details the process of Step 706 in FIG. 7 in which the absolute value of symbol N is encoded.

FIG. 9 is a flowchart which details the process of Step 706 in FIG. 7 in which the absolute value of symbol N is encoded. In FIG. 9, the value N is compared to 2 to the power of the suffix size s in Step 901. The operator "<<" calls for a bit-wise left shift and "1<<s" calls for a mathematical operation of 2 to the power of the suffix size s. If the absolute value of symbol N is larger than 2 to the power of the suffix size s, the flow proceeds to Step 902, in which a binary symbol A is encoded using the probability estimate p. Then, 2 to the power of the suffix size s is subtracted from the value of N in Step 903. Binarization is a process of mapping a non-binary symbol onto a string of binary symbols. Step 903 suggests that the value of (1<<s) taken out of the value of symbol N is mapped onto one binary symbol or bin. Thus, the value of (1<<s) represents a mapping value per a bin or a mapping unit value.

Then, the probability estimate p is updated in Step 904 through the above-described process shown in FIG. 8. The suffix size s is also updated in Step 905. The flow thereafter returns to Step 901, where the value N is compared to 2 to the power of the suffix size s or the mapping unit value. Therefore, the process loop of Steps 901, 902, 903, 904 and 905 is repeated until the value N becomes equal to, or smaller than, the mapping unit value. In the present invention, encoding and binarization are performed in parallel at each encoding round. At each round, the mapping unit value is taken recursively from the value of symbol N and mapped onto one bin at Step 903, and the bin is encoded at Step 902.

Figure 10:
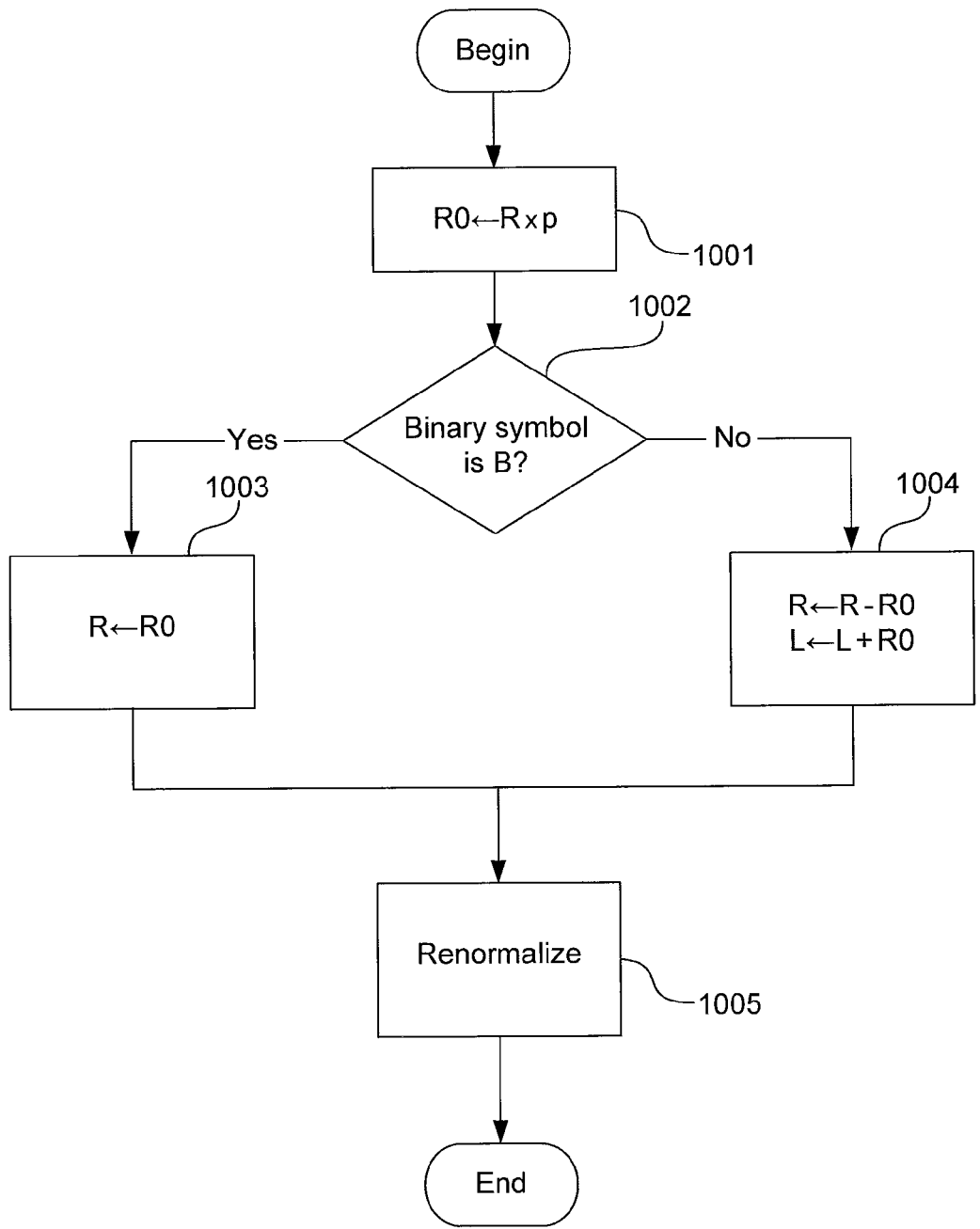
FIG. 10 is a flowchart which details the encoding process of Step 902 shown in FIG. 9.

FIG. 10 is a flowchart which details the encoding process of Step 902 shown in FIG. 9. In Step 1001, a sub-range value R0 for the binary symbol B is calculated by multiplying a current value R of a range register with the probability estimate p. It is then determined whether the binary symbol to be encoded is a symbol B in Step 1002. Where the binary symbol to be encoded is a symbol B, the range register is set to the sub-range value R0 in Step 1003. Where the binary symbol to be encoded is the symbol A, the sub-range R0 is subtracted from the current value R of the range register in Step 1004. Also, in Step 1004, a current value L of an offset register is summed with the sub-range value R0. Please note that since Step 901 in FIG. 9 is for encoding a binary symbol A, the decision made in Step 1002 of FIG. 10 leads to Step 1004. After the range register and the offset register are updated in Steps 1003 or 1004, renormalization is performed in Step 1005. Since one of ordinary skill in the art would know the renormalization process, this process is not described in further detail herein.

Figure 11:
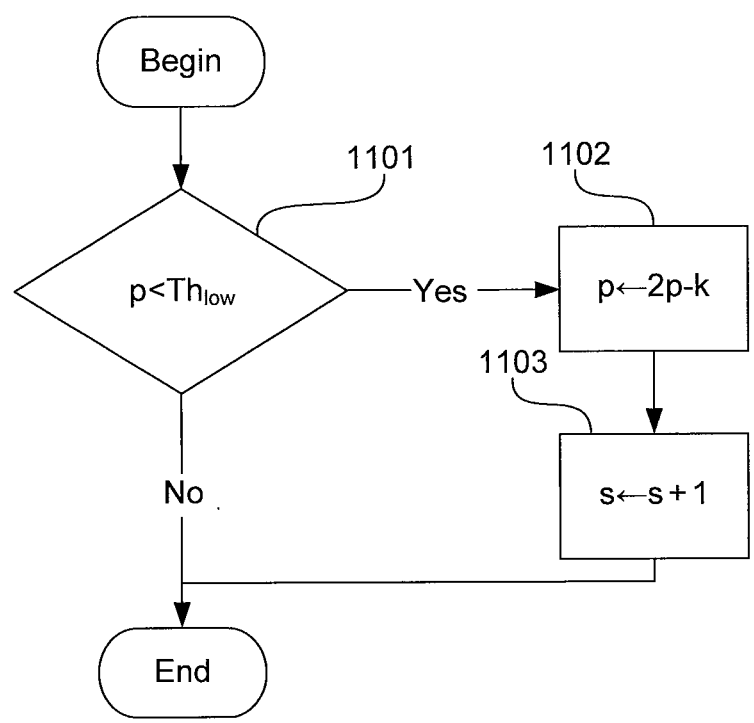
FIG. 11 is a flowchart which details the process performed in Step 905 of FIG. 9, in which the suffix size s is updated.

FIG. 11 is a flowchart which details the process performed in Step 905 of FIG. 9, in which the suffix size s is updated. The flowchart shown in FIG. 11 is invoked after the binary symbol A is encoded in Step 902 in FIG. 9. In Step 1101, the probability estimate p is compared to the threshold $Th_{low}$, used in the initialization process shown in FIG. 6. A value different from the threshold $Th_{low}$ may be used in the comparison step in Step 1101. If the probability estimate p is equal to or larger than the threshold $Th_{low}$, the process ends. If the probability estimate p is smaller than the threshold $Th_{low}$, the probability estimate p is adjusted in Step 1102 and the suffix size s is incremented by 1 in Step 1103. When the suffix s is incremented, the mapping unit value of (1<<s) increases and the symbol N is mapped onto a fewer number of bins. See Step 903 in FIG. 9. In other words, when the suffix s is incremented in Step 1103, a string of bins resulting from binarization becomes shorter.

As discussed in the initialization process shown in FIG. 6, when the probability estimate p is small, it is desirable to increase the suffix size s to improve the efficiency of arithmetic coding and reduce the complexity thereof. The probability estimate p needs to be adjusted due to an increment of the suffix size s. However, unlike the adjusting process performed on the probability estimate p in Step 604 of FIG. 6, the adjusting process performed in Step 1102 is simplified to avoid an operation of multiplication. Specifically, in Step 1102, 2 times p minus a constant k is assigned to the probability estimate p. The value of the constant k is selected to approximate the value of $(Th_{low})^2$. This simplification relies on the fact that the probability estimate p is close to the threshold $Th_{low}$, when the probability estimate p is determined smaller than the threshold $Th_{low}$, in Step 1101. In one embodiment, the threshold $Th_{low}$, and the constant k are expressed, using 16-bid fixed point numbers, such as ⅛ and 1/64, respectively.

Returning to FIG. 9, if it is determined in Step 901 that the value of symbol N is not larger than 2 to the power of the suffix size s, the binary symbol B is encoded in Step 906 using the probability estimate p. The binary symbol B is encoded through the encoding process shown in FIG. 10. The encoded binary symbol B functions as a separation bit for separating a prefix and a suffix in a bin string. The process then proceeds to Step 907, in which the value of N−1 is binarized into a bin string representing a suffix, using s bits, and encoded. More specifically, in Step 907, the value of N−1 is binarized using a fixed-length code of length S. A C-style pseudo code for generating the suffix is shown below:

```
while (s--)
    put(((N-1)>>s) & 0x01)
```

The resulting suffix is then encoded by the bypass coding engine 212 of FIG. 4. If the suffix size s is 0 ("zero"), no value is encoded. At this stage, since the maximum value of the symbol N is 2 to the power of the suffix size s, and the minim value of the symbol N is 1, s bits are sufficient to precisely encode the value of the symbol N. The probability estimate p is then updated in Step 908 through the process shown in FIG. 8.

Figure 12:
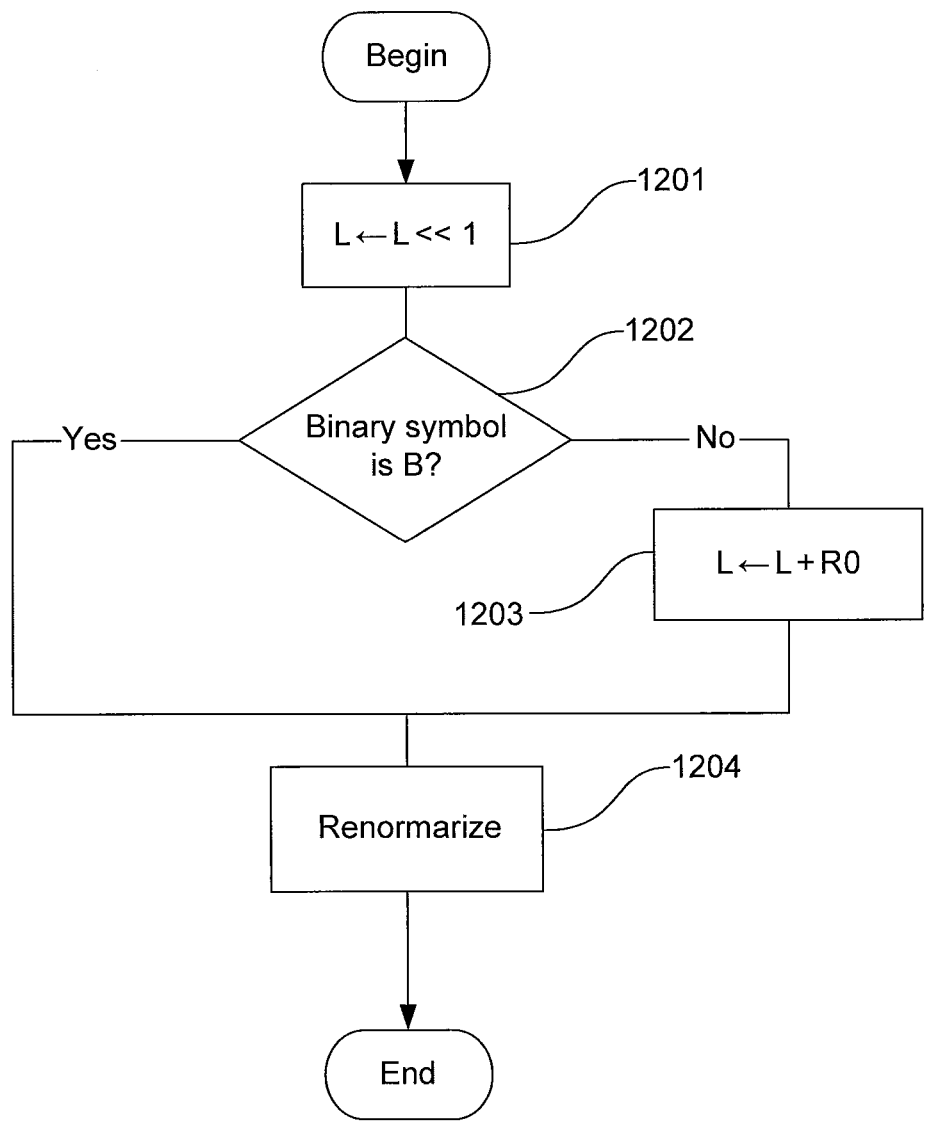
FIG. 12 is a flowchart showing an exemplary bypass encoding process.

FIG. 12 is a flowchart showing the process of bypass encoding such as performed in Step 707 in FIG. 7 and Step 907 in FIG. 9. In FIG. 12, the value of 1 is bit-wise left shifted for a current value of offset register and is assigned to the offset register in Step 1201. It is then determined in Step 1202 whether the binary symbol to be encoded is a symbol B. Where the binary symbol to be encoded is the symbol B, the flow proceeds to Step 1204, in which renormalization is performed. Where the binary symbol to be encoded is the symbol A, a current value L of an offset register is summed with a sub-range value R0 in Step 1203. After the offset register is updated, renormalization is performed in Step 1204.

Figure 13:
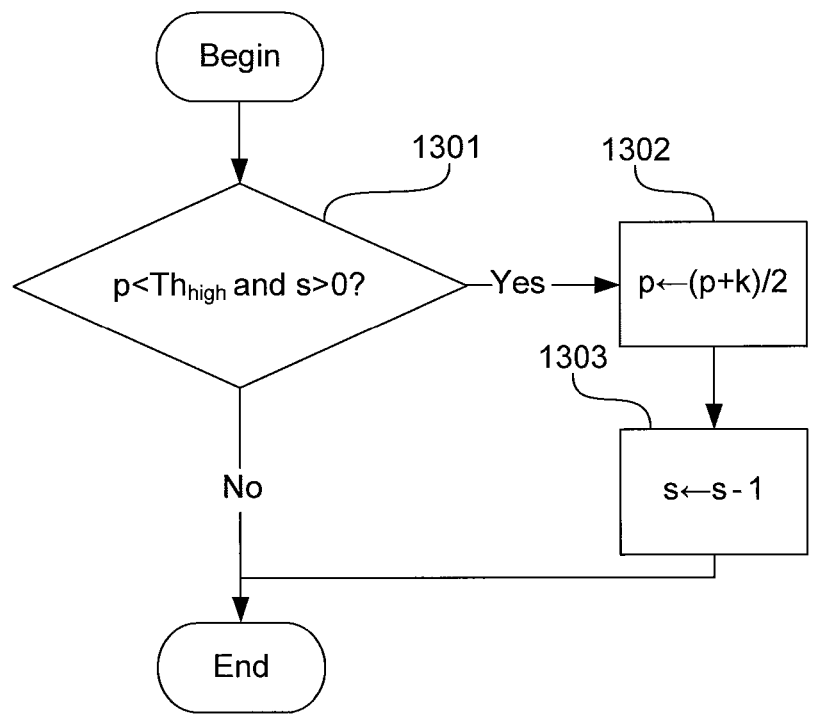
FIG. 13 is a flowchart which details the process performed in Step 909 of FIG. 9, in which the suffix size s is updated.

Returning to FIG. 9, the suffix size s is also updated in Step 909 through a process shown in FIG. 13, which is invoked when the last encoded binary symbol is a binary symbol B.

In FIG. 13, the probability estimate p is compared to a threshold $Th_{high}$ and the suffix size s is compared to 0 in Step 1301. In one embodiment, the threshold $Th_{high}$ is set to 2 times $Th_{low}$ minus k ($2Th_{low}$−k). When the probability estimate p is equal to or smaller than the threshold $Th_{high}$ or the suffix size s is equal to 0 ("zero"), the process ends. When the probability estimate p is larger than the threshold $Th_{high}$ and the suffix size s is larger than 0 ("zero"), the process proceeds to Steps 1302 and 1303, in which the suffix size s is decremented by 1 and the probability estimate p is adjusted to (p+k)/2. Please note that the probability adjustment performed in Step 1302 is the reverse of the adjusting operation shown in Step 1102 of FIG. 11. When the suffix s is decremented, the mapping unit value of (1<<s) decreases and the symbol N is mapped onto a more number of bins. See Step 903 in FIG. 9. In other words, when the suffix s is decremented in Step 1303, a string of bins resulting from binarization becomes longer.

It has been explained with FIG. 11 that a small probability estimate p impairs the coding efficiency. In the present invention, the suffix size s is incremented to improve the coding efficiency, where the probability estimate p is low. On the other hand, the probability estimates p are high, a steam of bins can be encoded with a fewer bits, and the coding efficiency improves. However, if a large number of symbols are encoded in a small number of bits, although the coding efficient improves, the overall processing speed at the decoder deteriorates. In the present invention, where the probability estimate p is high, the suffix size s is decreased to increase the number of bins in a bin stream, thereby lowering the coding efficiency. A decrease in the suffix size s lowers the coding efficiency but is expected to improve the overall process speed at the decoder.

Figure 14:
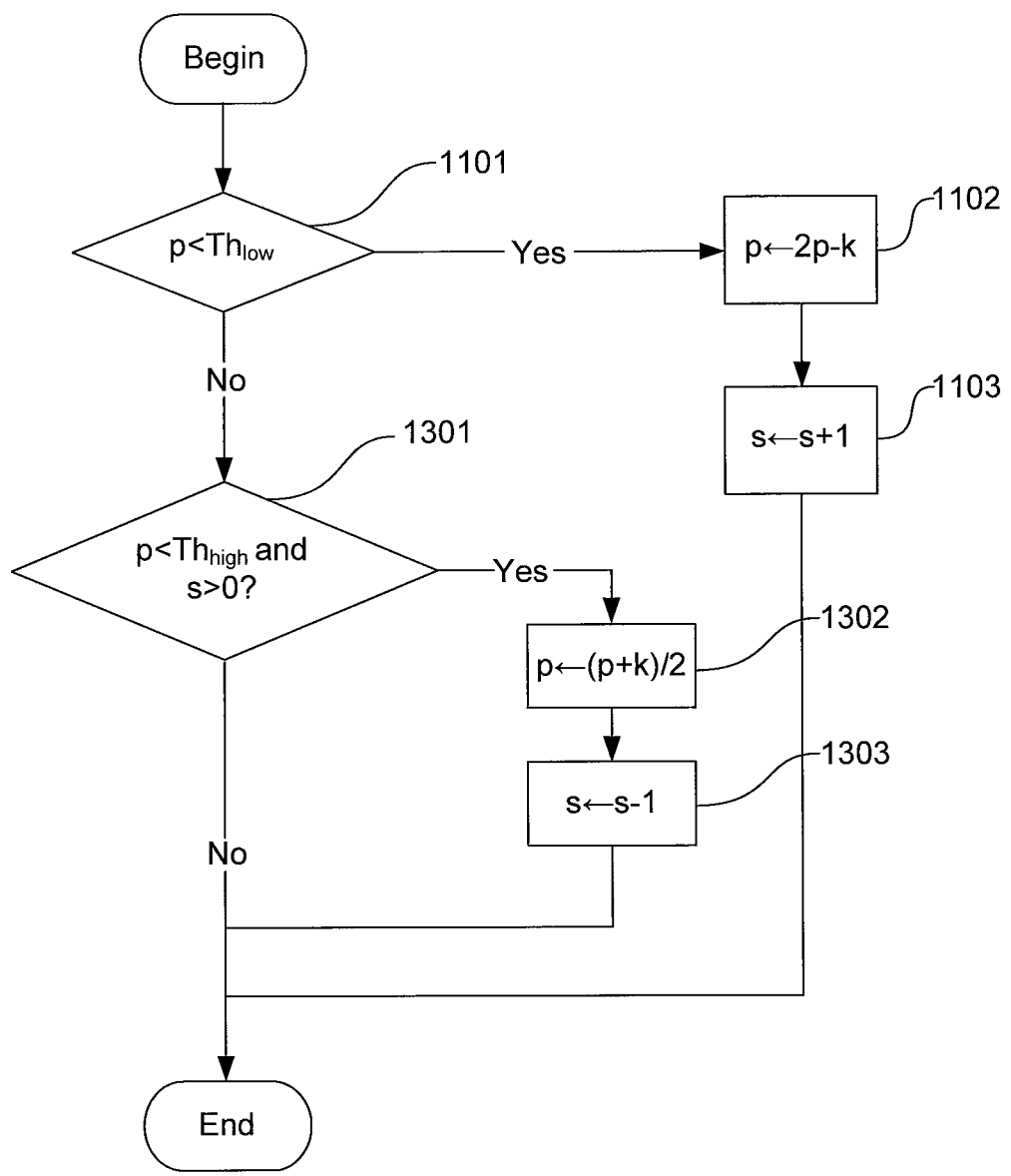
FIG. 14 is a flowchart in which processes of FIGS. 11 and 13 are combined.

Please note that the processes shown in FIGS. 11 and 13 may be combined into a single process as shown in FIG. 14, in which the steps are referenced with the same numbers as used in FIGS. 11 and 13. A C-style pseudo code for updating the suffix size s is shown below:

```
update_suffix(context) {
    if (p[context] < 0x2000) {
        p[context] = 2*p[context] - 0x400;
        suffix_size(context)++;
    }
    else if (p[context] > 0x3c00 && suffix_size[context] != 0) {
        p[context] = (p[context] + 0x400) >> 1;
        suffix_size[context] --;
    }
}
```

Turning now to the decoding processes according to the present invention, the attached flowcharts show decoding processes performed by the entropy decoder 301, in which arithmetic codewords are decoded back into the bin string, which is de-binarized into the symbol N. The decoding process is basically the reverse of the encoding process for undoing the processing performed on the symbol N by the entropy encoder 202. Please note that the decoding process shown in the flow charts are implemented collectively by the functional modules shown in FIG. 5, which are, as explained above, realized by the processor 101 executing the software 103 in the memory 102.

Figure 15:
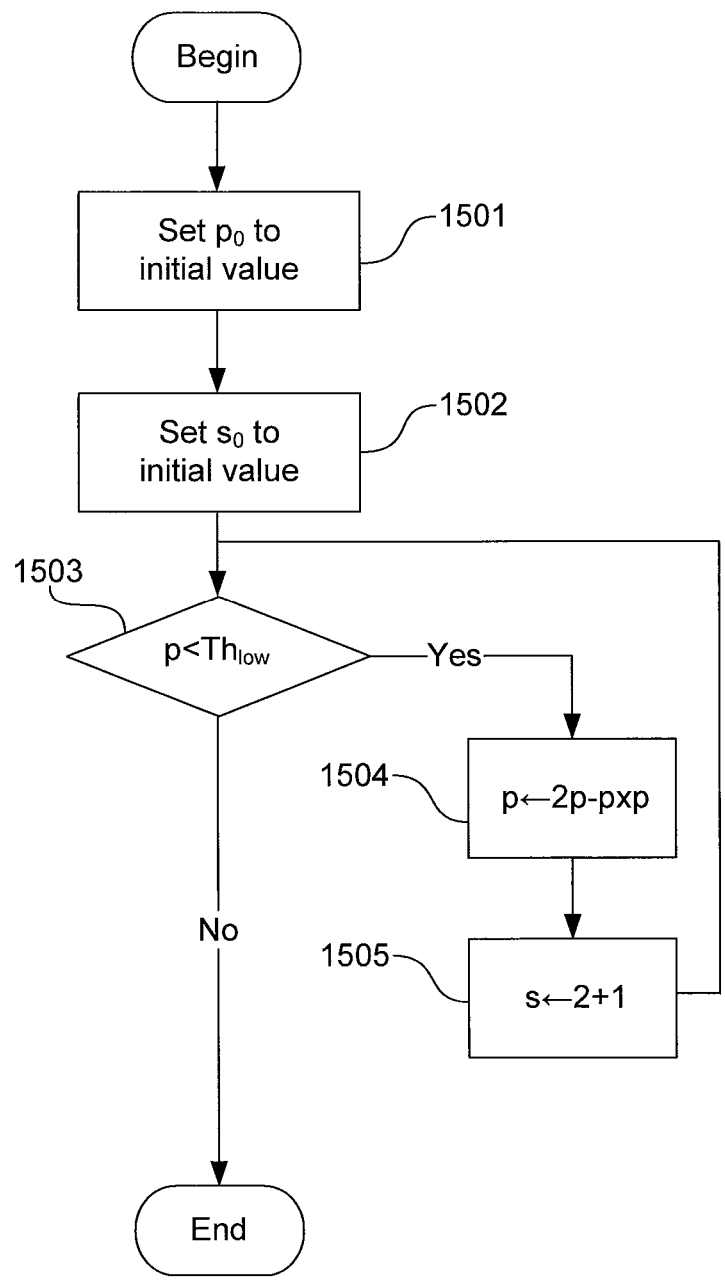
FIG. 15 is a flowchart showing an initialization process performed by an entropy decoder according to another embodiment of the present invention.

FIG. 15 is a flowchart showing an initialization process performed by the entropy decoder 301. In the initializing process, the probability estimate p is initialized to an initial probability estimate $p_0$ in Step 1501. The initial probability estimate $p_0$ is a predetermined value. In one embodiment, the initial probability estimate $p_0$ is a fixed-point representation of a probability larger than 0 and smaller than 1. In Step 1502, a suffix size s is also initialized to an initial suffix size $s_0$. The suffix size s is used in the decoder 301 to keep accurate track of transitions of bins in a bin string. In one embodiment, the initial suffix size $s_0$ is 0 ("zero"). In Step 1503, the probability estimate p is compared to a predetermined threshold $Th_{low}$, which should have the same value as the threshold $Th_{low}$ shown in FIG. 6. In one embodiment, the threshold $Th_{low}$ corresponds to a fixed-point representation of value ⅛.

If the probability estimate p is equal to or larger than the threshold $Th_{low}$, the initializing process ends. If the probability estimate p is smaller than the threshold $Th_{low}$, the process advances to Step 1504, in which 2 times p minus p to the power of 2 is assigned to the probability estimate p. The suffix size s is then incremented by 1 in Step 1505. The flow thereafter returns to the comparison step (Step 1502). Steps 1504 and 1505 are repeated until the probability estimate p becomes equal to or lather than the threshold $Th_{low}$. The rationales for the operations shown in Steps 1504 and 1505 are the same as described with FIG. 6 and thus not repeated here.

Figure 16:
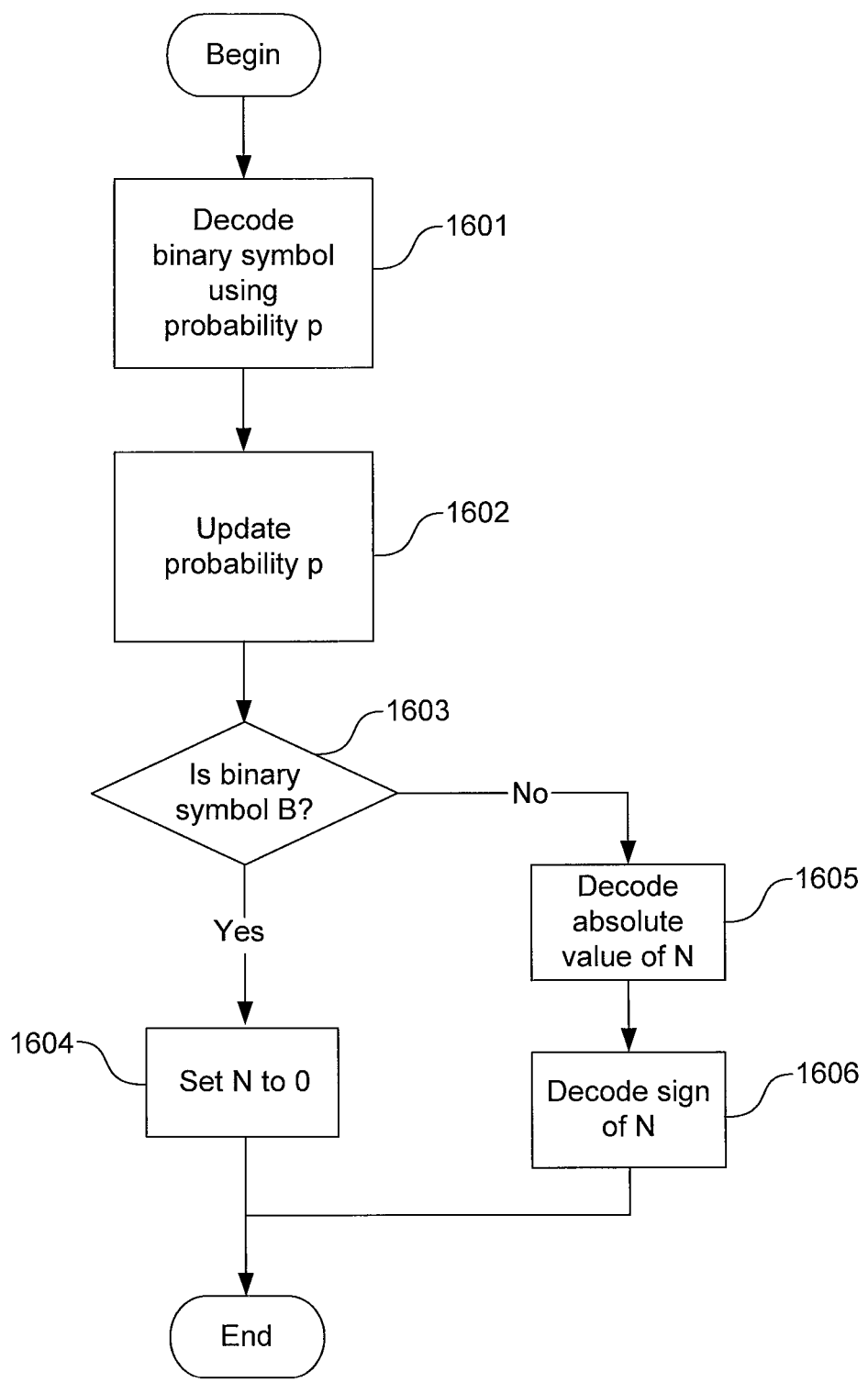
FIG. 16 is a flowchart showing a main decoding process performed by the entropy decoder.
Figure 17:
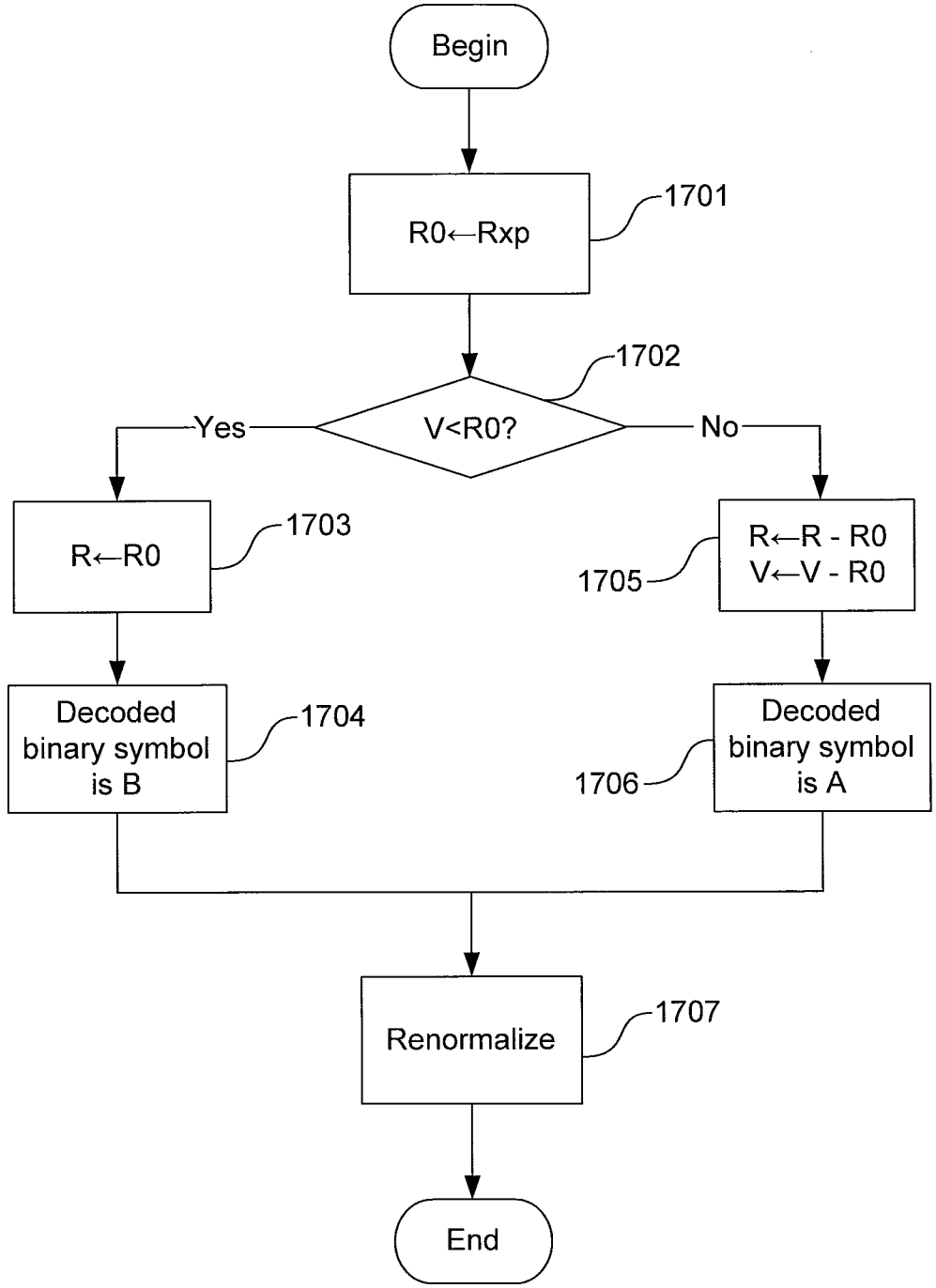
FIG. 17 is a flowchart showing a decoding process.

FIG. 16 is a flowchart showing a main decoding process performed by the entropy decoder 301. In Step 1601, the first arithmetic codeword is decoded to determine whether the value of the symbol N is 0 ("zero"). The decoding process is shown in FIG. 17. The probability estimate p is updated in Step 1602 through the process shown in FIG. 18. It is then determined in Step 1603 whether decoding of the first codeword yields a binary symbol B. If the binary symbol B is decoded out, the symbol N is set to 0 ("zero") in Step 1604 and the process ends.

FIG. 17 is a flowchart showing a decoding process performed by the arithmetic decoder 501 shown in FIG. 5. In Step 1701, a sub-range value R0 is computed by multiplying the value R of a range register with the probability estimate p. The sub-range value R0 is then compared to a value V of a value register in Step 1702. Where the sub-range value R0 is larger than the valve V of the value register, the range register is set to the sub-range value R0 in Step 1703, and a binary symbol B is emitted in Step 1704. Where the sub-range value R0 is equal to, or smaller than, the value V of the value register, the sub-range value R0 is subtracted from the range register, and the sub-range value R0 is subtracted from the value register in Step 1705. A binary symbol A is then emitted in Step 1706. The flow proceeds to Step 1707, in which renormalization is performed. Since one of ordinary skill in the art would know the renormalization process, this process is not described in further detail herein.

Figure 18:
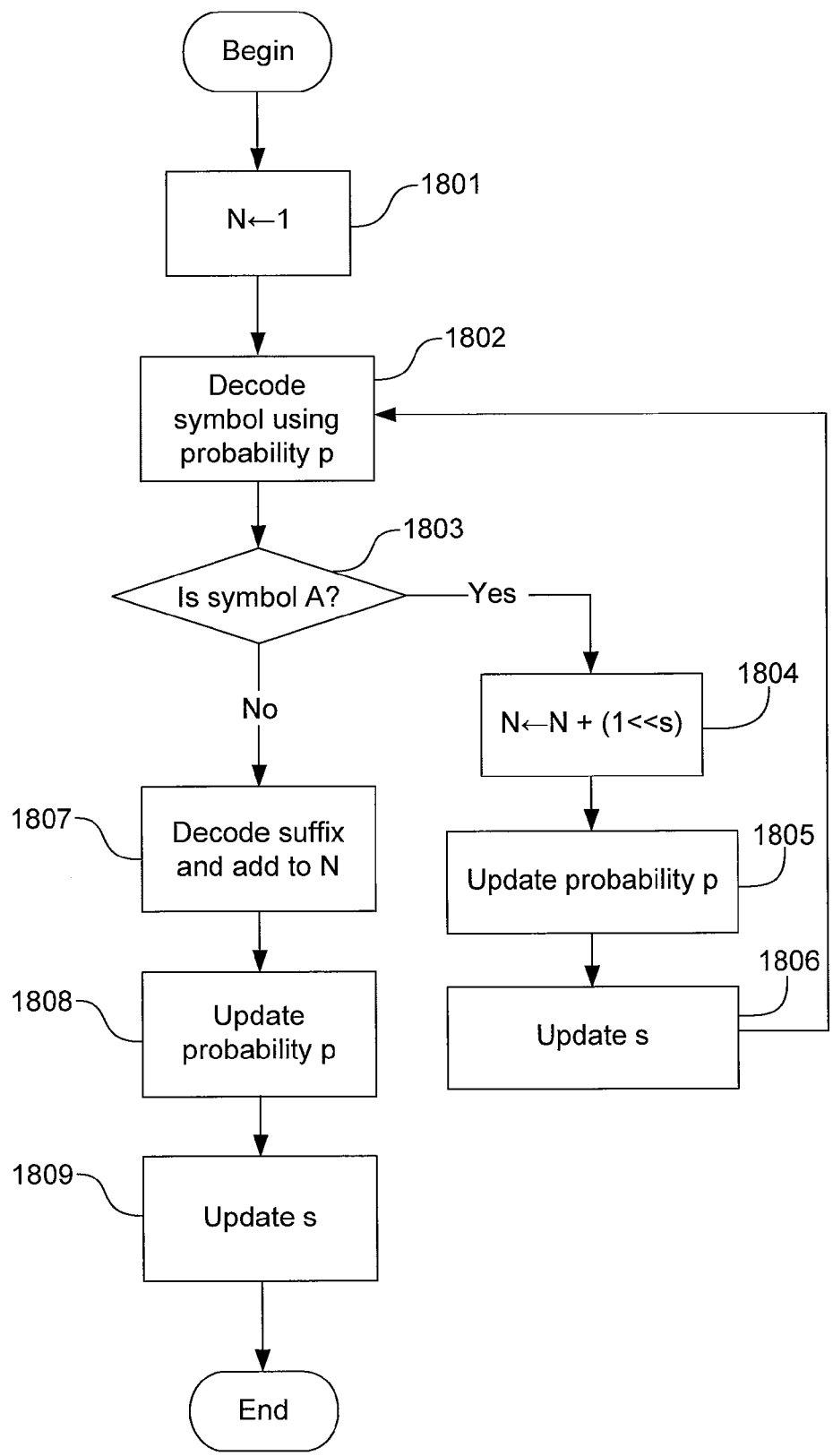
FIG. 18 is a flowchart showing an exemplary process for decoding an unsigned integer N.

Returning to FIG. 16, if decoding of the arithmetic codeword yields a binary symbol A, the flow proceeds to Step 1605, in which the absolute value of the symbol N is decoded through the process shown in FIG. 18. Then, a coded one-bit sign symbol is decoded in Step 1606 through the bypass decoding process shown in FIG. 19, which is performed by the bypass decoding engine 502 shown in FIG. 5. A C-style pseudo code for decoding a binary symbol or bin is shown below:

```
decode_symbol(context) (
    R0 = (R * p[context] + 0x8000) >> 16;
    R0 = R0 << 15;
    if (V < R0) (
        symbol = 0;
        R = R0;
    )
    else (
        symbol = 1;
        R = R - R0;
        V = V - R0;
    )
    while (R < 0x8000) (
        R = 2*R;
        V = 2*V + getbits(1);
    )
    update(context,symbol);
    return symbol;
)
```

FIG. 18 is a flowchart showing an exemplary process for decoding an unsigned integer N. In Step 1801, the value of N is set to 1. The next arithmetic codeword is decoded in Step 1802, using the probability estimate p, through the decoding process shown in FIG. 17. It is then determined in Step 1803 whether decoding of the next arithmetic codeword yields a binary symbol A. If a binary symbol A is decoded out of the next codeword, the flow proceeds to Step 1804, in which 2 to the power of the suffix size s is added to the value of N. Step 1804 suggests that through de-binarization, one bin is mapped back onto a mapping unit value (1<<s). Then, the probability estimate p is updated in Step 1805 through the process shown in FIG. 20. The suffix size s is also updated in Step 1806 through the process shown in FIG. 21. The flow returns to Step 1802 to decode a next arithmetic codeword. The process loop of Steps 1802-1806 is repeated until decoding of an arithmetic codeword yields a binary symbol B, which separates a prefix and a suffix of the bin string. In the present invention, decoding and de-binarization are performed in parallel at each decoding round.

Figure 19:
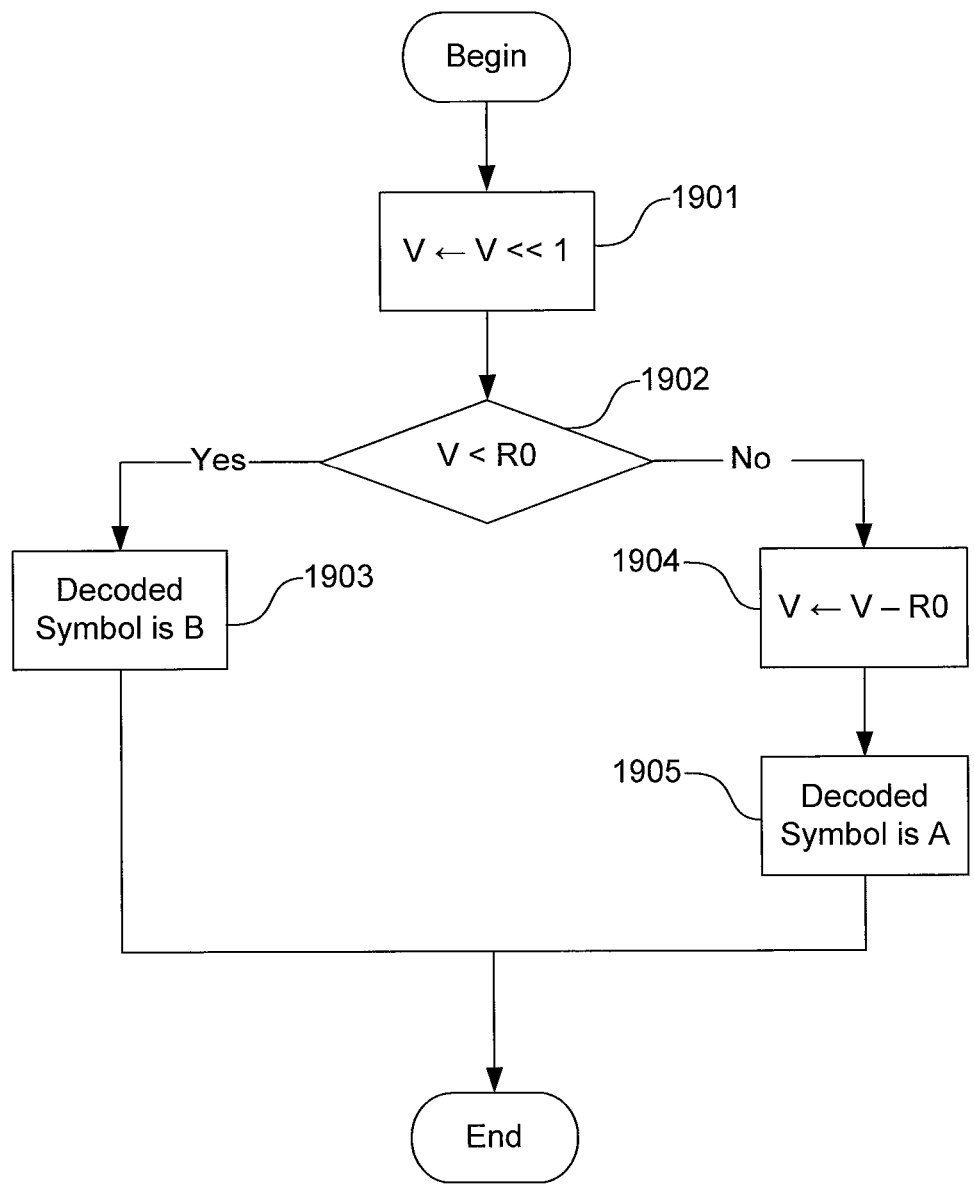
FIG. 19 is a flowchart showing an exemplary bypass decoding process.

FIG. 19 is a flowchart showing an exemplary bypass decoding process performed by the bypass decoding engine 502 shown in FIG. 5. In Step 1901, a binary value of 1 is bit-wise left shifted for the times equal to the value V of the value register and is assign to the value register. The sub-range value R0 is then compared to the value V of the value register in Step 1902. Where the sub-range value R0 is larger than the valve V of the value register, a binary symbol B is emitted in Step 1903. Where the sub-range value R0 is equal to or smaller than the value V of the value register, the sub-range value R0 is subtracted from the range register in Step 1904. A binary symbol A is then emitted in Step 1905.

Figure 20:
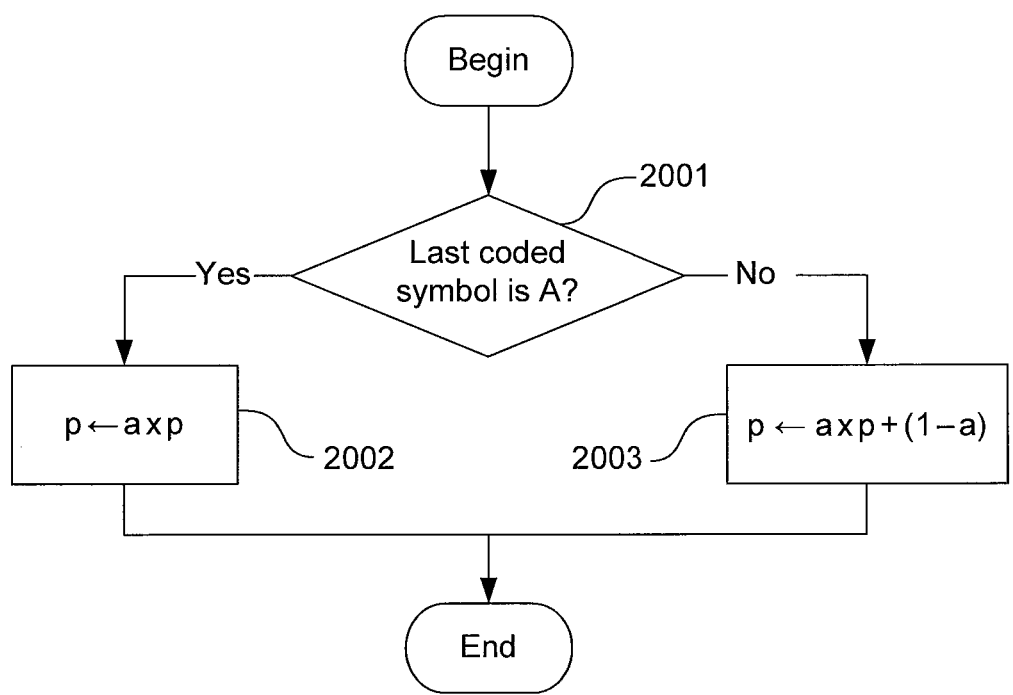
FIG. 20 is a flowchart showing a process of updating the probability estimate p performed in Steps 1602 in FIGS. 16 and 1805 in FIG. 18.

FIG. 20 is a flowchart showing a process of updating the probability estimate p performed in Steps 1602 in FIGS. 16 and 1805 in FIG. 18. In FIG. 20, it is determined in Step 2001 whether the last decoded symbol is a symbol A. A description of the processes in Steps 2002 and 2003 can be found above in the paragraph explaining FIG. 8 and thus is not repeated here.

Figure 21:
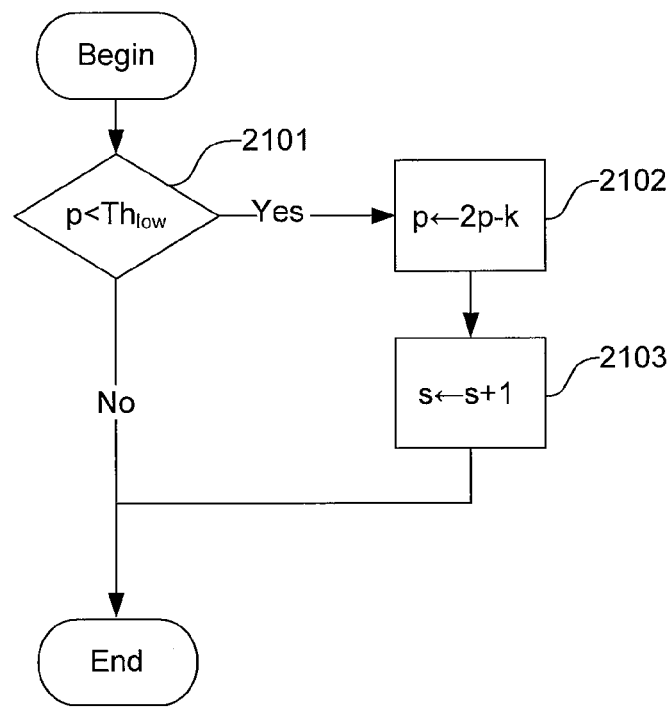
FIG. 21 is a flowchart which details the process performed in Step 1806 of FIG. 18, in which the suffix size s is updated.

FIG. 21 is a flowchart which details the process performed in Step 1806 of FIG. 18, in which the suffix size s is updated. The flowchart shown in FIG. 21 is invoked after decoding of an arithmetic codeword yields a binary symbol A. A description of Steps 2101, 2102 and 2103 can be found in the paragraph explaining FIG. 11 and is not repeated here.

Returning to FIG. 18, if the decoded binary symbol is not a binary symbol A in Step 1803, the flow proceeds to Step 1807, in which the remaining arithmetic codewords are decoded through the bypass decoding process shown in FIG. 19 by decoding s bins to form an s-bit unsigned integer value, which is added to the value of N. The probability estimate p is updated in Step 1808 through the process shown in FIG. 20. The suffix size s is also updated in Step 1809 through the process shown in FIG. 22. A description of processes performed in Steps 2201-2203 in FIG. 22 can be found above in the paragraph explaining FIG. 13 and is not repeated here. A C-style pseudo code for decoding an integer symbol is shown below:

```
decode_symbol_unary(context) {
    symbol = 1;
    while (decode_symbol (context) == 1) {
        symbol += 1 << suffix_size[context];
        update_suffix(context);
    }
    for (i=suffix_size[context]-1; i>=0; i--)
        symbol += decode_symbol_fixed( ) << i;
    update_suffix(context);
    return symbol;
}
```

Figure 23:
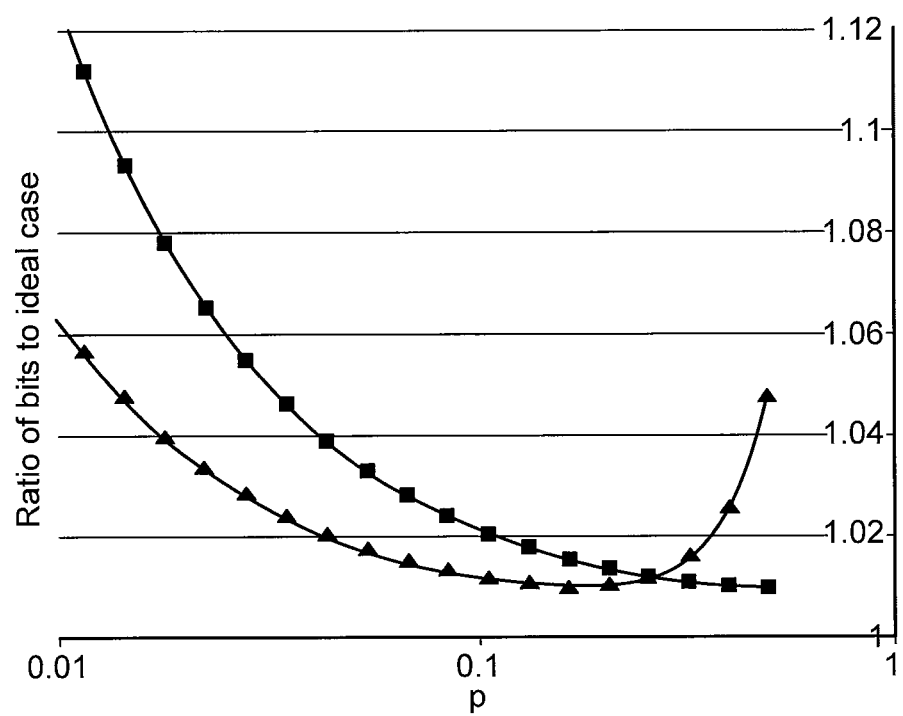
FIG. 23 is a graph showing the efficiency of an embodiment according to the present invention.

FIG. 23 is a graph showing the efficiency of the present invention. The horizontal axis represents the parameter p of the source. The vertical axis represents a ratio of bits generated by a model, according to the present invention, to bits generated by the optimal model or the entropy of the source. There are two curves are shown in the graph. The curve connecting "■" is a performance curve exhibited by a conventional model which does not use the adjustable suffix size s, according to the present invention. The curve connecting "▲" is a performance curve exhibited by a model which uses the present invention, in which the suffice size s is equal to 1. It can be seen that when the parameter p takes high values, the conventional model is more efficient than the model, according to the present invention, whereas as the value of the parameter p becomes low, the model, according to the present invention, becomes more efficient than the conventional model.

As discussed above, the ordinary coding engine 408 shown in FIG. 4 and the ordinary decoding engine 501 shown in FIG. 5 may be a finite state machine. The finite state machine has tables associated with context models. Each context model table has stored probability estimates. The finite state machine does not calculate probability estimates. Instead, the finite state machine has all the probability estimates as predefined constants in the context model tables. The probability estimates stored in each context model table are selectively identified by a probability index. The processes of the flowcharts described above may be modified as follows to provide descriptions of the processes performed by the finite state machine:

The finite state machine according to the present invention uses a pStateIdx and a ThStateIdx. The pStateIdx is a probability state index which identifies a probability estimate among probability estimates indexed in the context model tables. An exemplary structure of the context model table is shown in FIG. 24 in which probability estimates $p_0$, $p_1$, $p_2$ ... are stored in relation to indexes 0, 1, 2 ..., i.e., an index value of pStateIdx.

FIG. 6 is modified as follows to describe the initialization process for the finite state machine: An initial probability estimate $p_0$ in Step 601 becomes p(pStateIdx$_0$). pStateIdx$_0$ represents the index which identifies the initial probability estimate $p_0$ stored in the context model table such as shown in FIG. 24. The comparison operation of "p<Th$_{low}$" in Step 603 is replaced with "p(pStateIdx)<p(ThlowStateIdx)". p(pStateIdx) is a probability estimate stored in the context model table which is identified by a current index value of pStateIdx. p(ThlowStateIdx) is a probability representative of a threshold$_{(low)}$. If a relationship holds between pStateIdx and p(pStateIdx) and between ThlowStateIdx and p(ThlowStateIdx) that as the index value becomes larger, p(pStateIdx) and p(ThlowStateIdx) become smaller as defined in H.264/AVC, the comparison in Step 603 may be replaced with "pStateIdx>ThlowStateIdx". The update operation of "p←2p−p×p" in Step 604 is replaced with "pStateIdx←TransIdx(pStateIdx)". The finite state machine additionally has a transition table such as shown in FIG. 26, in which adjusted index values of pStateIdx are stored in relation to a current index values of pStateIdx. The transition table functions in such a way that for a probability estimate p identified by a current value of pStateIdx, TransIdxdx (pStateIdx) provides an adjusted index, which identifies the location of the context table at which the value "2p−p×p" is stored.

In FIG. 7, the operation of "using probability p" in Steps 702 and 704 is replaced with "using probability p(pStateIdx)". The operation of "Update p" in Steps 703 and 705 is replaced with "Update pStateIdx".

The update operations of "p←a×p" in Step 802 and "p←a× p+(1−a)" in Step 803 in FIG. 8 are replaced with "pStateIdx←pUpdateIdxB(pStateIdx)" and "pStateIdx←pUpdateIdxA(pStateIdx)", respectively. The finite state machine additionally has an update table such as shown in FIG. 26, in which updated index values of pStateIdx are stored in relation to a current index value of pStateIdx. The update table functions in such a way that for a probability estimate p identified by a current value of pStateIdx, pUpdateIdxA(pStateIdx) provides an updated index which identifies the location of the context table at which the value "p←a×p+(1−a)" is stored, and pUpdateIdxB(pStateIdx) provides an updated index, which identifies the location of the context table at which the value "p←a×p" is stored.

In FIG. 9, the operations in Steps 902, 904, 906 and 908 are modified similarly to Steps 703, 704, 704 and 705 in FIG. 7. In FIG. 10, the operation of "R0←R×p" is replaced with "R0←R×p(pStateIdx)".

In FIG. 11, the operation of "p←2p−k" in Step 1102 may be replaced with "pStateIdx←TransIdx(pStateIdx)" because "p←2p−k" is an approximation of "2p−p×p". As explained above, in the transition table such as shown in FIG. 26, adjusted index values of pStateIdx are stored in relation to a current index value of pStateIdx. When the operation in Step 1102 is so replaced, the operation of "p←(p+k)/2" in Step 1302 of FIG. 13 is replaced with "pStateIdx←TransIdx$^{-1}$ (pStateIdx)". TransIdx$^{-1}$(pStateIdx) means that the transition table is looked up in the direction opposite to the direction in which the table is looked up when TransIdx(pStateIdx) is performed. The operation of "p←2p−k" in Step 1102 may be replaced with "pStateIdx←pStateIdx−kStateIdx", where kStateIdx represents a difference between a current index value of pStateIdx and an adjusted index value thereof. When the operation in Step 1102 is so replaced, the operation of "p←(p+k)/2" in Step 1302 of FIG. 13 is replaced with "pStateIdx←pStateIdx+kStateIdx". The operation of "p>Th$_{high}$" in Step 1301 of FIG. 13 is replaced with "pStateIdx<ThhighStateIdx". p(ThhighStateIdx) is a probability representative of a threshold$_{(high)}$. The operation of "p>Th$_{high}$" in Step 1301 of FIG. 13 may be replaced with "pStateIdx<ThlowStateIdx–kStateIdx".

Figure 22:
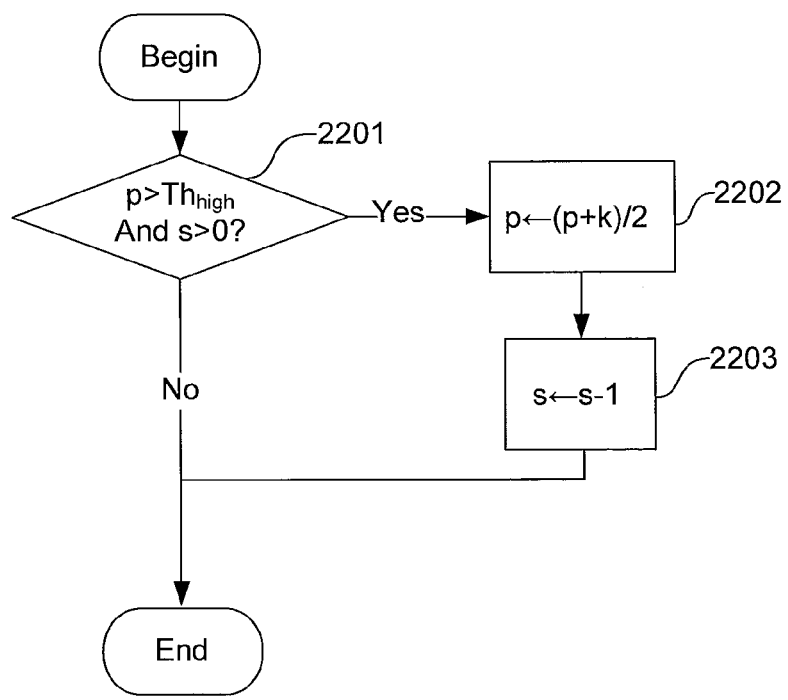
FIG. 22 is a flowchart which details the process performed in Step 1809 of FIG. 18, in which the suffix size s is updated.

Steps 1501, 1503 and 1504 in FIG. 15 are modified similarly to the corresponding steps in FIG. 6. The Steps 1601 and 1602 in FIG. 16 are modified similarly to Steps 702 and 703 in FIG. 7. Step 1701 of FIG. 17 is modified similarly to Step 1001 of FIG. 10. Steps 1802, 1805 and 1808 are modified similarly to the corresponding steps of FIG. 9. FIG. 20 is modified similarly to FIG. 8. FIGS. 21 and 22 are modified similarly to FIGS. 11 and 13, respectively.

As shown in FIGS. 9 and 18, in the embodiments described above, the suffix size s is updated each time a binary symbol is encoded or decoded (Step 905 and Step 1806). The suffix size s may be updated less frequently. For example, the suffix size s may be may be done only once during encoding or decoding of a respective integer symbol N.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as essential to the invention.

The invention claimed is:

1. An arithmetic encoder comprising:
   a binarizer configured to binarize a mapping unit value from a non-binary symbol into one binary symbol at each encoding round; and
   an arithmetic coding engine configured to encode binary symbols from the binarizer one at each encoding round, using a probability parameter which is transitionable over encoding rounds, wherein the mapping unit value from the non-binary symbol is variable adaptively to the probability parameter.

2. An arithmetic encoding method comprising computer executable steps executed by a processor of a video encoder to implement:
   binarizing a mapping unit value from an non-binary symbol into one binary symbol at each encoding round; and
   encoding binary symbols one at each encoding round, using a probability parameter which is transitionable over encoding rounds, wherein the mapping unit value is variable adaptively to the probability parameter.

3. The arithmetic encoding method according to claim 2, further comprising determining the mapping unit value, using a size parameter which is variable adaptively to the probability parameter.

4. The arithmetic encoding method according to claim 3, further comprising subtracting the mapping unit value recursively from the non-binary symbol at each encoding round until the reminder value of the non-binary symbol becomes equal to or lower than the mapping unit value.

5. The arithmetic encoding method according to claim 2, further comprising updating the probability parameter at each encoding round.

6. The arithmetic encoding method according to claim 3, further comprising determining, based on the probability parameter, at each round whether the size parameter needs to be varied.

7. The arithmetic encoding method according to claim 3, further comprising varying the size parameter varies to increase the mapping unit value when the probability parameter is low.

8. The arithmetic encoding method according to claim 7, further comprising adjusting the probability parameter to compensate an increase in the mapping unit value.

9. The arithmetic encoding method according to claim 3, further comprising varying the size parameter to decrease the mapping unit value when the probability parameter is high.

10. The arithmetic encoding method according to claim 9, further comprising adjusting the probability parameter to compensate a decrease in the mapping unit value.

11. The arithmetic encoding method according to claim 4, further comprising, when the reminder value of the non-binary symbol becomes equal to or lower than the mapping unit value, converting the reminder value of the non-binary symbol into suffix binary symbols, using the size parameter, and encoding the suffix binary symbols at once.

12. An arithmetic decoder comprising:
    an arithmetic decoding engine configured to decode arithmetic codewords into binary symbols one at each decoding round, using a probability parameter which is transitionable over decoding rounds; and
    a de-binarizer configured to de-binarize the binary symbols one at each decoding round into mapping unit values summed for reconstruction of an non-binary symbol, wherein the mapping unit value is variable adaptively to the probability parameter.

13. An arithmetic decoding method comprising computer executable steps executed by a processor of a video decoder to implement:
    decoding arithmetic codewords into binary symbols one at each decoding round, using a probability parameter which is transitionable over decoding rounds; and
    de-binarizing the binary symbols one at each decoding round into mapping unit values summed for reconstruction of an non-binary symbol, wherein the mapping unit value is variable adaptively to the probability parameter.

14. The arithmetic decoding method according to claim 13, further comprising determining the mapping unit value, using a size parameter which is variable adaptively to the probability parameter.

15. The arithmetic decoding method according to claim 13, further comprising updating the probability parameter at each encoding round.

16. The arithmetic decoding method according to claim 14, further comprising determining, based on the probability parameter, at each decoding round whether the size parameter needs to be varied.

17. The arithmetic decoding method according to claim 14, further comprising varying the size parameter to increase the mapping unit value wherein when the probability parameter is low.

18. The arithmetic decoding method according to claim 17, further comprising adjusting the probability parameter to compensate an increase in the mapping unit value.

19. The arithmetic decoding method according to claim 14, further comprising varying the size parameter to decrease the mapping unit value when the probability parameter is high.

20. The arithmetic decoding method according to claim 19, further comprising adjusting the probability parameter to compensate a decrease in the mapping unit value.

21. The arithmetic decoding method according to claim 13, further comprising, when a binary symbol from the arithmetic decoding engine is a separation binary symbol, decoding reminder arithmetic codewords into suffix binary symbols.

22. The arithmetic decoding method according to claim 21, further comprising de-binarizing the suffix binary symbols into a value to be added to reconstruct the non-binary symbol.

* * * * *